(12) United States Patent
Fujii et al.

(10) Patent No.: US 6,462,632 B1
(45) Date of Patent: Oct. 8, 2002

(54) COMPOSITE SAW FILTER WITH A SAW FILTER AND A WITHDRAWAL WEIGHTED OR ELECTRODE REVERSED SAW RESONATOR

(75) Inventors: Yasuhisa Fujii, Kyoto; Yuichi Takamine, Matto, both of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/557,710

(22) Filed: Apr. 25, 2000

(30) Foreign Application Priority Data

Apr. 28, 1999 (JP) ............................................. 11-122690

(51) Int. Cl.[7] .............................. H03H 9/64; H03H 9/25
(52) U.S. Cl. ...................... 333/193; 333/195; 333/196; 310/313 B
(58) Field of Search ................................ 333/193–196; 310/313 R, 313 B, 313 C, 313 D

(56) References Cited

U.S. PATENT DOCUMENTS

| | | | |
|---|---|---|---|
| 4,616,197 A | | 10/1986 | Wright ......................... 333/194 |
| 5,610,566 A | * | 3/1997 | Chen et al. ............. 333/195 X |
| 5,694,096 A | * | 12/1997 | Ushiroku et al. ........ 333/193 X |
| 5,717,367 A | * | 2/1998 | Murai ..................... 333/193 X |
| 5,770,985 A | * | 6/1998 | Ushiroku et al. ........... 333/193 |
| 5,844,453 A | * | 12/1998 | Matsui et al. ............... 333/193 |
| 5,864,262 A | * | 1/1999 | Ikada ......................... 333/193 |
| 6,259,366 B1 | * | 7/2001 | Ichikawa ..................... 333/193 |

FOREIGN PATENT DOCUMENTS

| | | |
|---|---|---|
| EP | 0 682 410 A1 | 11/1995 |
| EP | 0 746 095 A1 | 12/1996 |
| JP | 61-157112 | 7/1986 |
| JP | 62-188512 | 8/1987 |
| JP | 6-45860 | 2/1994 |
| JP | 07131290 | 5/1995 |
| JP | 10-261932 | 9/1998 |
| JP | 2000-49568 | 2/2000 |
| WO | WO 90 03691 | 4/1990 |

* cited by examiner

*Primary Examiner*—Benny Lee
*Assistant Examiner*—Barbara Summons
(74) *Attorney, Agent, or Firm*—Keating & Bennett, LLP

(57) ABSTRACT

A surface acoustic wave resonator includes a piezoelectric substrate and an interdigital transducer on the piezoelectric substrate. The interdigital transducer includes first and second comb-shaped electrodes having one or more electrode fingers which are interdigitated with each other. When the first comb-shaped electrode is connected to a positive potential, the second comb-shaped electrode is connected to a negative potential, and the electrode finger connected to the positive potential and the electrode finger connected to the negative potential are reversed in at least one pair of the electrode fingers in an area where electrode fingers connected to the positive potential and electrode fingers connected to the negative potential are alternately arranged in the direction of surface-wave propagation.

17 Claims, 21 Drawing Sheets

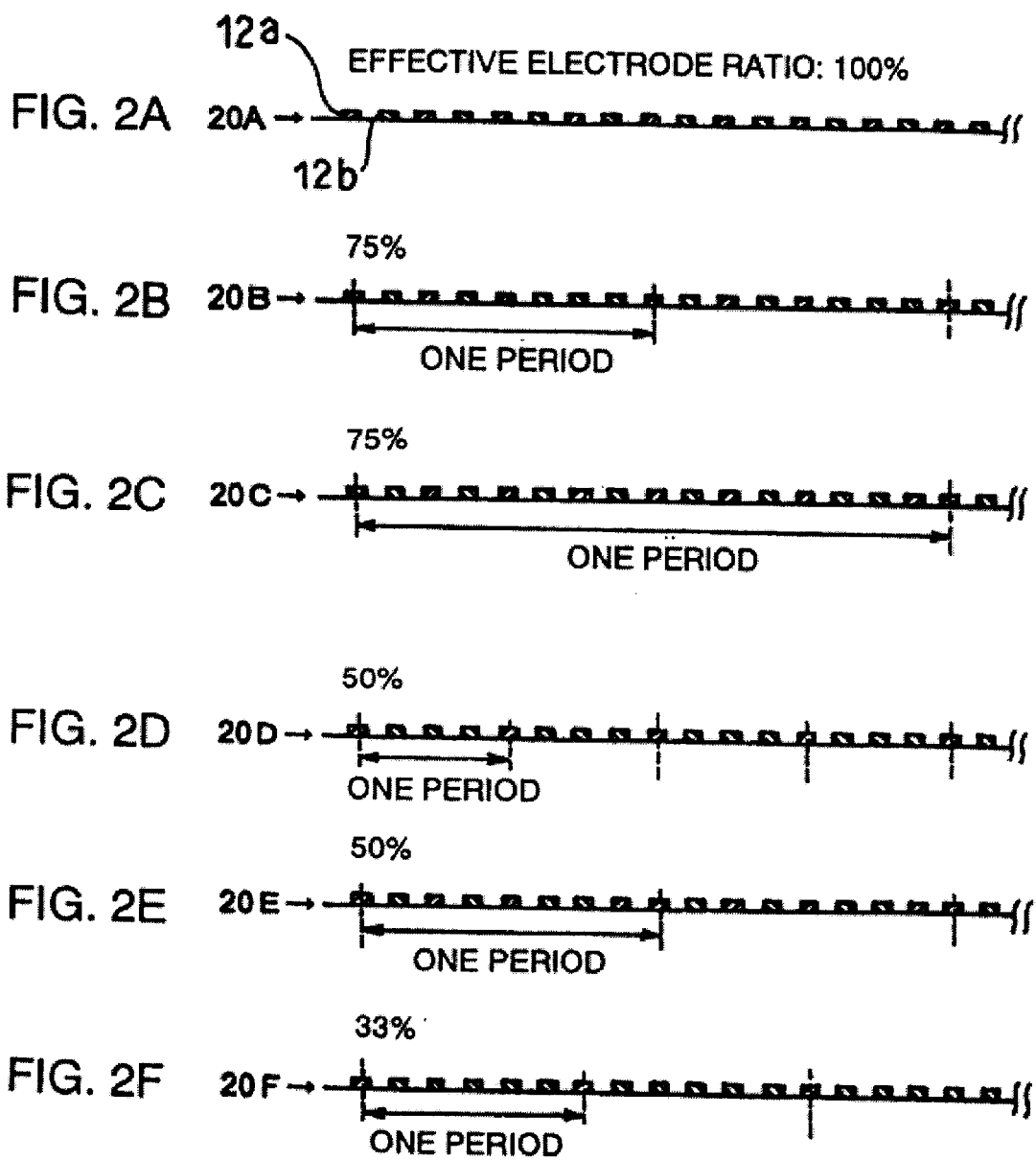

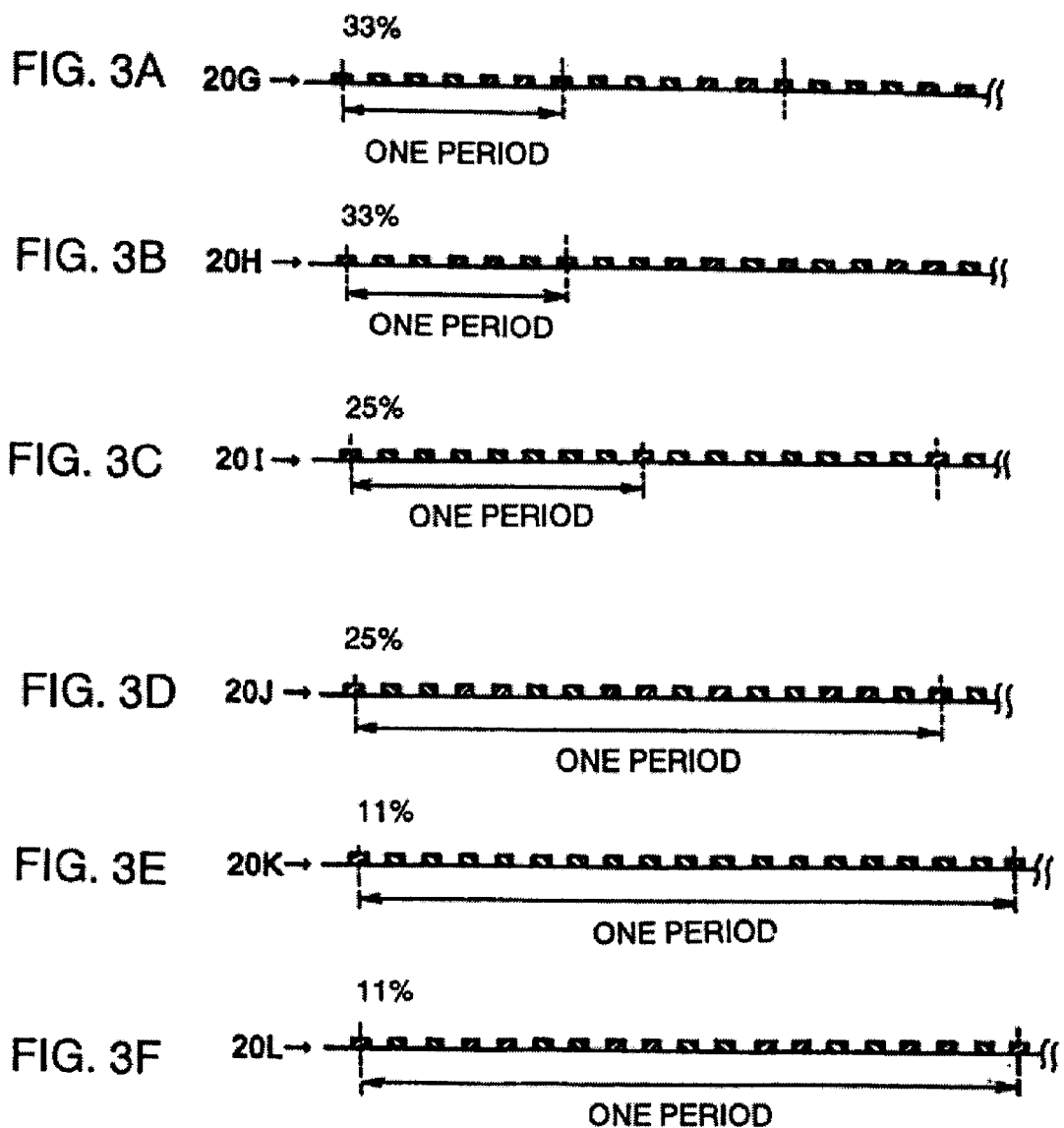

COMPOSITE SAW FILTER WITH A SAW FILTER AND A WITHDRAWAL WEIGHTED OR ELECTRODE REVERSED SAW RESONATOR

BACKGROUND OF THE INVENTION

1. Field of the Invention

The present invention relates to a one port type SAW resonator and a surface acoustic wave (SAW) filter that are included in, for example, a band-pass filter or other filter for use in portable telephones and other communication devices.

2. Description of the Related Art

SAW filters are widely used as band-pass filters in portable telephones and other communication devices. In recent communication systems, such as portable telephones, the transmitting frequency band and the receiving frequency band are close to each other. Therefore, attenuation characteristics in the vicinity of the ends of the passband, that is, sharpness in the attenuation characteristics, are increasingly required.

To meet the above-described requirements, a composite SAW filter is disclosed in Japanese Unexamined Patent Application Publication No. 7-131290. In this composite SAW filter, a first SAW resonator is connected in parallel to one of an input terminal filter and an output terminal of a SAW filter, and a second SAW resonator is series-connected thereto.

For the above-mentioned prior art, a high impedance in the vicinity of an antiresonant frequency in the first SAW resonator series-connected is used to provide the sharpness in cutoff characteristics of the high-band side of the passband of the SAW filter. It is also described that a low impedance in the vicinity of a resonant frequency in the second SAW resonator connected in parallel is used to provide the sharpness in cutoff characteristics of the low-band side of the passband of the SAW filter.

In the above-described method according to the prior art, the antiresonant frequency in the first SAW resonator must be arranged to be closer to the passband on the high-band side of the passband. Also, the resonant frequency in the second SAW resonator must be arranged to be closer to the passband on the low-band side of the passband.

However, when the antiresonant frequency in the first SAW resonator is arranged to be closer to the passband, a high impedance in the vicinity of the antiresonant frequency affects the high-band side of the passband. This increases insertion losses on the high-band side of the passband. Similarly, when the resonant frequency in the second SAW resonator is arranged to be closer to the passband, the low impedance in the vicinity of the resonant frequency influences the low-band side of the passband. This increases the insertion loss on the low-band side of the passband.

That is, the above-described method according to the prior art causes a problem in that the insertion loss in the passband is increased when the amount of attenuation in the vicinity is very close to the passband.

FIG. 25 is a graph showing frequency-amplitude characteristics, which is used to explain the aforementioned inverse effects that occur when the SAW resonator is connected in parallel to the SAW filter.

In FIG. 25, broken lines indicate a frequency-amplitude characteristic of a simple substance of the SAW filter, and solid lines indicate a characteristic provided when a SAW resonator of which an impedance-frequency characteristic indicated by a broken line in FIG. 15 is connected in parallel to the above-described SAW filter.

A graph on a magnified scale shows the characteristics magnified on a scale on the right of the vertical axis. The figure showing a frequency-amplitude characteristic, which is referred to below, is similarly presented.

As is apparent in FIG. 25, when the SAW resonator is connected in parallel, amounts of attenuations increase in the vicinity of the high-band side of the passband, particularly, in frequency zones where amounts of attenuations increase from 10 dB.

However, when the resonant frequency of the SAW resonator is arranged to be close to the passband, the low-band side of the passband is influenced according to the influence of the low impedance in the vicinity of the resonant frequency. This indicates that, as shown by the solid lines, the insertion loss increases. As a result, when the sharpness on the low-band side of the passband is judged using the frequency pitch in positions where amounts of attenuations are 3 dB and 20 dB as a criteria, the frequency interval in the simple substance of the SAW filter is 3.3 MHz while it is only 3.6 MHz when the SAW resonator is connected in parallel. Thus, no improvement in the sharpness has been achieved.

FIG. 26 is a graph showing frequency-amplitude characteristics, which is used to explain the aforementioned inverse effects that occur when the SAW resonator is series-connected to the SAW filter. In FIG. 26, broken lines indicate a frequency-amplitude characteristic of the simple substance of the SAW filter, and solid lines indicate a characteristic provided when a SAW resonator of which an impedance-frequency characteristic indicated by a broken line in FIG. 18 is series-connected to the SAW filter.

As is apparent in FIG. 26, when the SAW resonator is series-connected to the SAW filter, amounts of attenuations increase in the vicinity of the low-band side of the passband, particularly, in the vicinity of 913 MHz, which corresponds to the antiresonant frequency of the SAW resonator. However, similar to the above, the high-band side of the passband is affected by the influence of the high impedance in the vicinity of the antiresonant frequency. When the sharpness in the frequency-amplitude characteristic on the high-band side of the passband is judged using the frequency pitch at positions where amounts of attenuations are 3 dB and 8 dB as a criteria, the frequency interval in the simple substance of the SAW filter is 2.2 MHz while it is 3.4 MHz when the SAW resonator is series-connected. Thus, no improvement in the sharpness has been achieved.

To prevent the decrease in the passband, that is, the adverse effects in the insertion loss, in the case of the parallel connection, the vicinity of the antiresonant frequency in the SAW resonator is simply arranged so as to agree with the passband. In the case of the series connection, the vicinity of the resonant frequency in the SAW resonator is simply arranged so as to agree with the passband. As a result of the actual connection, as described above, however, the resonant frequency in the case of the series connection is farther from the vicinity of the passband, thereby disabling large amounts of attenuations in the vicinity very close to the passband. That is, according to the conventional method in which the SAW resonator is connected to the SAW filter, large amounts of attenuations in an area that is very close to the passband and preferable insertion losses in the passband are incompatible.

SUMMARY OF THE INVENTION

To overcome the problems described above, preferred embodiments of the present invention provide a SAW resonator and a SAW filter including the SAW resonator, the SAW resonator being arranged to control the frequency interval between the resonant frequency and the antiresonant frequency and adapted to define a ladder circuit and various other types of SAW filters, and furthermore, being adapted to be connected to the SAW filter in the above-mentioned composite SAW filter.

Preferred embodiments of the present invention also provide a composite SAW filter in which the SAW resonator of the present invention is series-connected to and/or connected in parallel to the SAW filter, thereby achieving sharpness in filter characteristics in the vicinity of the passband, and concurrently, achieving insertion losses in the passband.

A SAW resonator according to a preferred embodiment of the present invention includes a piezoelectric substrate and an interdigital transducer (which is abbreviated as an "IDT", hereinbelow) on the piezoelectric substrate, the IDT including first and second comb-shaped electrodes having one or more electrode fingers which are interdigitated with each other, wherein, when the first comb-shaped electrode is connected to a positive potential, the second comb-shaped electrode is connected to a negative potential, and the electrode finger connected to the positive potential and the electrode finger connected to the negative potential are reversed in at least one pair of the electrode fingers in an area where electrode fingers connected to the positive potential and electrode fingers connected to the negative potential are alternately arranged in the direction of surface-wave propagation.

A SAW resonator according to another preferred embodiment of the present invention includes a piezoelectric substrate and an IDT on the piezoelectric substrate, the IDT including first and second comb-shaped electrodes having one or more electrode fingers which are interdigitated with each other, wherein the IDT is subjected to one of withdrawal weighting and electrode reversal, and also, the effective-electrode ratio in the IDT is in a range of about 10% to about 80%. The electrode reversal refers to a configuration wherein the electrode finger connected to the positive potential and the electrode finger connected to the negative electrodes according to the preferred embodiment described above are reversed, and the meaning of the electrode reversal is described below in detail.

In the SAW resonators according to the preferred embodiments of the present invention described above, the frequency interval between a resonant frequency and an antiresonant frequency is preferably in a range of about 5% to about 75% of the frequency interval between a resonant frequency and an antiresonant frequency in a regular IDT having the same number of the electrode-finger pairs.

Also, the effective-electrode ratio in the IDT is preferably in a range of about 10% to about 50%.

In a specific case of the SAW resonators according to the preferred embodiments described above, the frequency interval between the resonant frequency and the antiresonant frequency is preferably in a range of about 5% to about 30% of the frequency interval between the resonant frequency and the antiresonant frequency in the IDT having the same number of the pairs.

Also, in the SAW resonators according to the preferred embodiments described above, reflectors may be provided outside of the IDT in the direction of surface-wave propagation direction.

According to another preferred embodiment of the present invention, a composite SAW filter is provided; and in the composite SAW filter, at least one of the SAW resonators according to the preferred embodiments described above is electrically series-connected and/or connected in parallel to a SAW filter via at least one of an input-end side and an output-end side of the SAW filter.

In a specific example of this preferred embodiment, the SAW resonator is series-connected to the SAW filter, and the antiresonant frequency is a frequency in a stopband in the vicinity of the high-band side of the passband of the SAW filter.

In another specific example of the SAW filter according to this preferred embodiment, the SAW resonator is connected in parallel to the SAW filter, and the resonant frequency is available in a stopband in the vicinity of the low-band side of the passband of the SAW filter.

According to another preferred embodiment of the present invention, a SAW filter having a ladder-type circuit configuration is provided. In the SAW filter having the ladder-type circuit configuration, multiple SAW resonators are configured in series arms and shunt arms, and at least one of the SAW resonators is defined by one of the SAW resonators according to the preferred embodiments described above.

According to yet another preferred embodiment of the present invention, a SAW filter having a ladder-type circuit configuration is provided and in which multiple SAW resonators are arranged in series arms and shunt arms, thereby defining the ladder-type circuit. Also, the effective-electrode ratio in an IDT in at least one of the SAW resonators is in a range of about 10% to about 95%.

According to a SAW resonator according to a preferred embodiment of the present invention, when a first comb-shaped electrode is connected to a positive potential, a second comb-shaped electrode is connected to a negative potential, and the electrode finger connected to the positive potential and the electrode finger connected to the negative potential are reversed in at least one pair of the electrode fingers, that is, electrode reversal is performed, in an area where electrode fingers connected to the positive potential and electrode fingers connected to the negative potential are alternately arranged in the direction of surface-wave propagation. Therefore, the effective-electrode ratio is reduced to be lower than that of a regular-type IDT, thereby allowing the frequency interval between a resonant frequency and an antiresonant frequency. Accordingly, the frequency interval between the resonant frequency and the antiresonant frequency can be adjusted by controlling the amount of the electrode reversal. Therefore, by connecting the SAW resonator as one of a series trap and a shunt trap to a SAW filter, sharpness in filter characteristics in the vicinity of the passband is greatly increased with almost no influence being exerted on the passband.

In addition, in the SAW resonator of a preferred embodiment of the present invention, since the electrode reversal, not withdrawal, is used to reduce the frequency interval between the resonant frequency and the antiresonant frequency, the area of the IDT portion is greatly reduced.

In a SAW resonator according to another preferred embodiment of the present invention, one of the withdrawal weighting and the electrode reversal is performed, and the effective-electrode ratio in the IDT is within a range of about 10% to about 80%. Therefore, similarly to the preferred embodiment described in the preceding paragraph, the frequency interval between the resonant frequency and the antiresonant frequency can be reduced to be smaller than if the regular-type IDT is used. Therefore, using the SAW resonator of this preferred embodiment as one of the series trap and the shunt trap for the SAW filter allows the sharpness in filter characteristics in the vicinity of the passband to be greatly increased with almost no influence being exerted on the passband.

In preferred embodiments of the present invention, when the frequency interval between the resonant frequency and the antiresonant frequency is controlled to be in a range of about 5% to about 75% of the frequency interval between the resonant frequency and the antiresonant frequency in the regular-type IDT, using the preferred embodiment of the present invention as one of the series trap and the shunt trap of the SAW filter allows the sharpness in the filter characteristics in the vicinity of the passband to be increased even more efficiently, and also, allows increase in the amount of attenuation in bands that are somewhat remote from the passband to be realized much more efficiently.

In the SAW resonator of preferred embodiments of the present invention, when the effective-electrode ratio in the IDT is within a range of about 10% to about 50%, connecting the SAW resonator as one of the series trap and the shunt trap to the SAW filter allows the sharpness in the filter characteristics in the vicinity of the passband to be increased even more efficiently, and also, allows desirable insertion losses in the passband to be realized even more efficiently.

In preferred embodiments of the present invention, when the frequency interval between the resonant frequency and the antiresonant frequency is controlled to be within a range of about 5% to about 30% of the frequency interval between the resonant frequency and the antiresonant frequency in the IDT, the aforementioned effective-electrode ratio can be controlled to be in a range of about 10% to about 50%. Therefore, as described above, using preferred embodiments of the present invention as one of the series trap and the shunt trap of the SAW filter allows the sharpness in the filter characteristics in the vicinity of the passband to be increased even more efficiently, and also, allows insertion losses in the passband to be sufficiently great.

In a composite SAW filter according to yet another preferred embodiment of the present invention, since at least one of the SAW resonators according to preferred embodiments described above is electrically series-connected and/or connected in parallel to at least one of an input-end side and an output-end side of the SAW filter, the sharpness in the vicinity of the passband is greatly increased, and also, insertion losses in the passband are effectively reduced.

In the SAW filter of this preferred embodiments of the present invention, when the SAW resonator is series-connected to the SAW filter and when the antiresonant frequency is arranged to be a frequency in a stopband in the vicinity of the high-band side of the passband of the SAW filter, the aforementioned SAW resonator functions as a series stopband, thereby allowing amounts of attenuations in the vicinity of the passband in the high-band side of the passband to be greatly increased, and also, allows desirable insertion losses in the passband to be realized.

In the composite SAW filter of this preferred embodiment of the present invention, when the SAW resonator is connected in parallel to the SAW filter and when the resonant frequency is arranged to be a frequency in a stopband in the vicinity of the low-band side of the passband of the SAW filter, it functions as a shunt stopband, thereby allowing amounts of attenuations in the vicinity of the passband in the low-band side of the passband to be greatly increased, and also, allows reduction in insertion losses in the passband to be implemented.

In a SAW filter according to another preferred embodiment of the present invention, multiple SAW resonators are arranged in series arms and shunt arms, and at least one of the SAW resonators is configured according to the above-described preferred embodiments of present invention. Therefore, the sharpness in filter characteristics in the vicinity of the passband is greatly increased.

Also, in a SAW filter according to another preferred embodiment of the present invention, multiple SAW resonators are arranged in series arms and shunt arms, thereby configuring a ladder-type circuit, and the effective-electrode ratio in an IDT in at least one of the SAW resonators is controlled to be in a range of about 10% to about 95%. Therefore, similarly to the preferred embodiments described above, the sharpness in filter characteristics in the vicinity of the passband are greatly increased.

For the purpose of illustrating the invention, there are shown in the drawings several forms which are presently preferred, it being understood, however, that the invention is not limited to the precise arrangements and instrumentalities shown.

BRIEF DESCRIPTION OF THE DRAWINGS

FIGS. 2A to 2F are, individually, schematic cross-sectional views showing relationships between electrode-finger arrangements and effective-electrode ratios of IDTS.

FIGS. 3A to 3F are, individually, schematic cross-sectional views showing relationships between electrode-finger arrangements and effective-electrode ratios of IDTs.

DETAILED DESCRIPTION OF PREFERRED EMBODIMENTS

Figure 1:
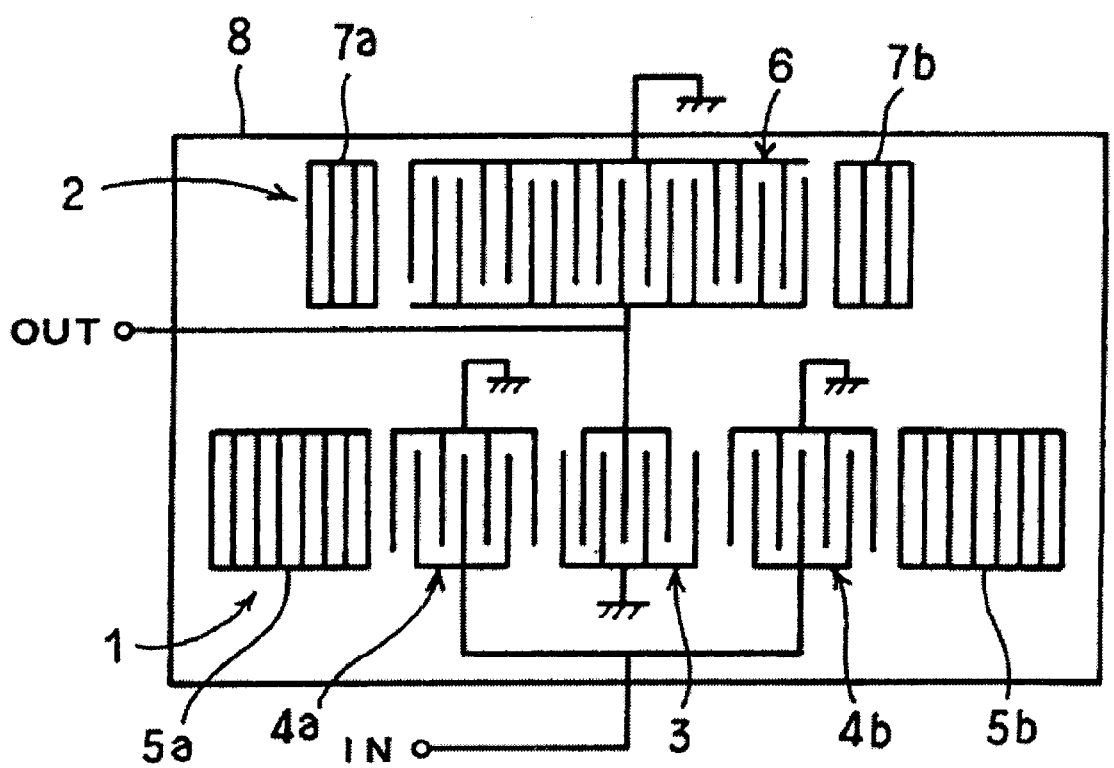
FIG. 1 is a schematic plan view used to explain a composite SAW filter according to a first preferred embodiment of the present invention.

Hereinbelow, referring to the drawings, a description will be provided of a SAW resonator and a composite SAW filter according to preferred embodiments of the present invention.

FIG. 1 is a schematic plan view that is used to explain a first preferred embodiment of a composite SAW filter according to the present invention.

In the composite SAW filter of this preferred embodiment, a SAW filter 1 and a SAW filter 2 are preferably disposed on a piezoelectric substrate 8 made of a 36-degree Y-cut X-propagation $LiTaO_3$. Electrode materials defining the SAW filter 1 and the SAW filter 2 are not specifically restricted, but aluminum materials are preferably used.

The SAW filter 1 is preferably a vertically-coupled dual mode SAW filter in a three-IDT configuration that has IDTs 3, 4a, and 4b. Also, reflectors 5a and 5b are preferably provided at both sides in a surface-wave propagation direction of areas where the IDTs 3, 4a, and 4b are arranged.

Each of the IDTs 3, 4a, and 4b preferably includes a pair of comb-shaped electrodes. The comb-shaped electrode on one side of each of the IDTs 4a and 4b that are commonly connected is connected to an input terminal IN. The comb-shaped electrode on the other side of each of the IDTs 4a and 4b is connected to a ground potential.

Also, the comb-shaped electrode on one side of the IDT 3 is connected to a ground potential, and the comb-shaped electrode on the other side thereof is connected to an output terminal OUT.

The single-pair-terminal SAW resonator 2 is connected to an output side of the IDT 3 in parallel to the SAW filter 1. More specifically, the output end of the IDT 3 is electrically connected to a first comb-shaped electrode of an IDT 6 of the SAW resonator 2. Also, a second comb-shaped electrode of the IDT 6 is connected to a ground potential.

In the SAW resonator 2, reflectors 7a and 7b are preferably provided at both sides of the IDT 6 in the surface-wave propagation direction.

In the SAW filter 1, the IDTs 4a and 4b are input-side IDTs, and the IDT 3 is the output-side IDT. However, conversely, the IDT 3 may be connected to the input terminal, and the IDTs 4a and 4b may be connected to the output terminal.

Hereinbelow, a description will be provided of configurations of the individual IDTs 3, 4a, and 4b with reference to particular examples. However, preferred embodiment of the present invention are not restricted to the example configurations described below.

Assumptions are now made such that the number of electrode-finger pairs in the IDT 3 of the SAW filter 1 is 36; the number of electrode-finger pairs of the IDTs 4a and 4b is 22; the number of electrode-finger pairs of the reflectors 5a and 5b is 100; and each electrode-finger-pair cross width in the IDTs 3, 4a, and 4b is about 60 $\mu$m. Design conditions including these conditions of the SAW filter 1 may be optionally changed depending on a desired characteristic.

Also, each electrode-finger-pair cross width in the IDT 6 of the SAW resonator 2 is assumed to be about 80 $\mu$m, and the number of electrode-finger pairs is assumed to be 80; that is, the number of the electrode fingers is assumed to be 161.

The number of electrode-finger pairs of the reflectors 7a and 7b of the SAW resonator 2 is assumed to be 50. Even when the reflectors 7a and 7b are omitted, since the number of the electrode fingers of the IDT 6 is as many as 161, internal reflections occur. Therefore, reduction in Q values at resonant points and antiresonant points do no cause serious problems.

Each pitch of the IDTs and the reflectors in the SAW filter 1 and the SAW resonator 2, that is, the electrode-finger width plus the inter-electrode-finger interval width is arranged to be about ½ of a wavelength $\lambda$ of an elastic surface wave that is excited at desired frequencies.

As shown in FIG. 1, the IDT 6 is not a regular-type IDT. In the regular-type IDT, electrode fingers connected to a first comb-shaped electrode and electrode fingers connected to a second comb-shaped electrode are arranged alternately in a surface-wave propagation direction. In other words, electrode fingers momentarily connected to a positive potential (which are referred to as positive electrodes, hereinbelow) and electrode fingers momentarily connected to a negative potential (which are referred to as negative electrodes, hereinbelow) are alternately arranged.

In the IDT 6, however, the positive electrodes and the negative electrodes are not alternately arranged. Regularity in the arrangement of the electrode fingers in the IDT 6 is shown as an electrode arrangement 20J in FIG. 3D.

Hereinbelow, referring to FIGS. 4A to FIG. 6C, a description will be provided of definitions of presentation methods for individual electrode arrangements shown in FIGS. 2 and 3.

Figure 4A:
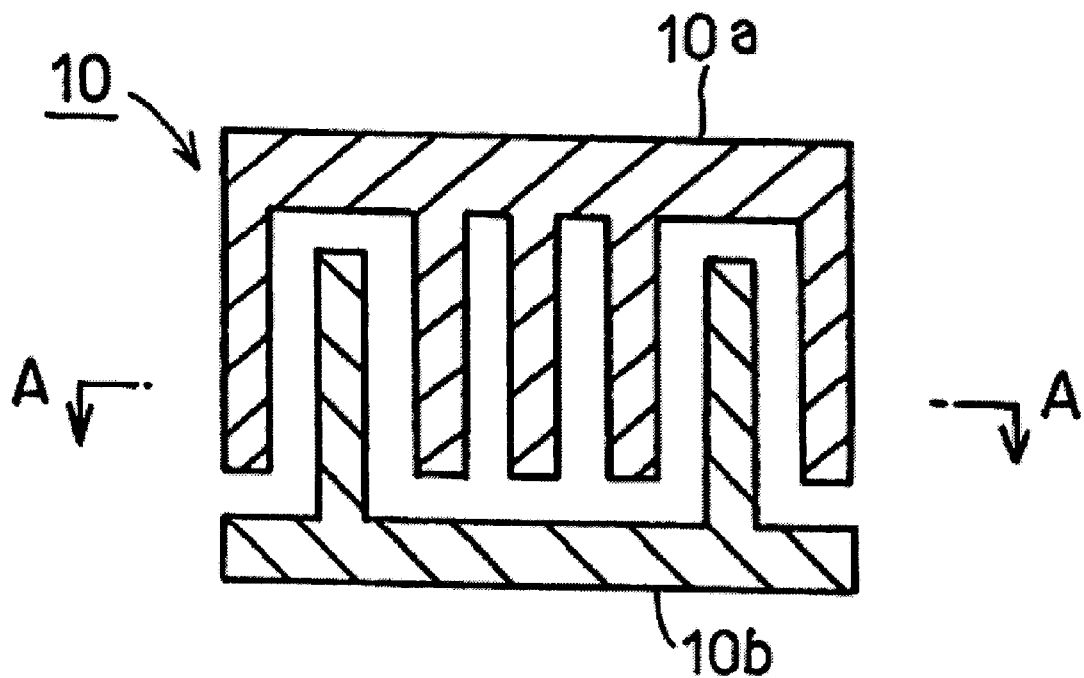
FIGS. 4A and 4B are, respectively, a plan view and a cross-sectional view along line A—A of FIG. 4A which are used to explain electrode-finger arrangements in IDTs.
Figure 4B:
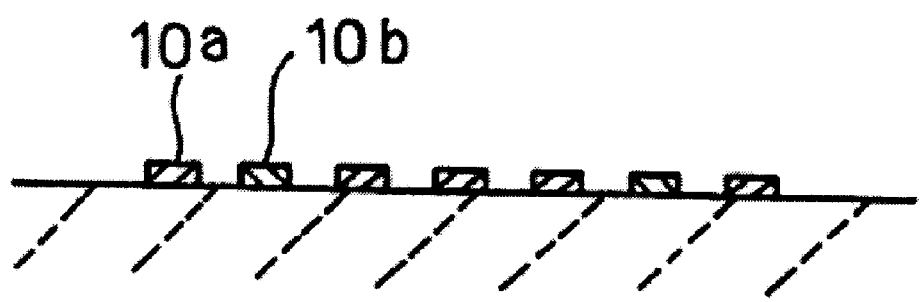

FIGS. 4A and 4B are a plan view of an IDT 10 having first and second comb-shaped electrodes 10a and 10b and a cross-sectional view along the line A—A of the plan view, respectively.

In the IDT 10, an AC electric field is applied between the first and second comb-shaped electrodes 10a and 10b while it is driven. However, when the comb-shaped electrode 10a is connected to a positive potential, the comb-shaped electrode 10b is connected to a negative potential. Therefore, when electrode fingers of the comb-shaped electrode 10a work as positive electrodes, electrode fingers of the comb-shaped electrode 10a work as negative electrodes.

Figure 5:
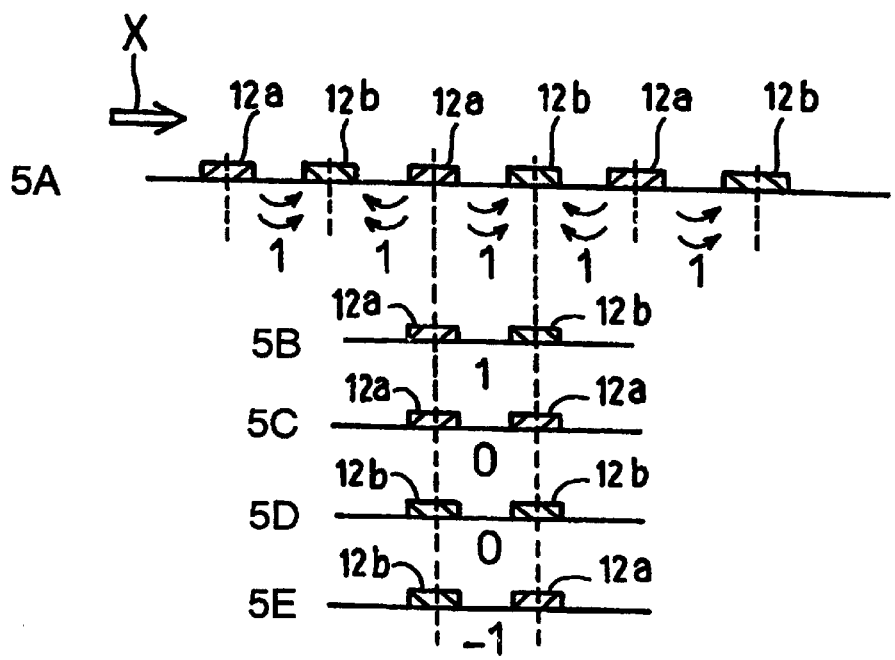
FIG. 5 is a schematic cross-sectional view explaining coding of electrode-finger arrangements.

Similarly to FIG. 4B, FIG. 5 is a cross-sectional view showing electrode fingers of an IDT sectioned along the surface-wave propagation direction. As in FIG. 5, the IDT 5A is a regular-type IDT in which positive electrodes 12a and 12b are alternately arranged at a moment of time along the surface-wave propagation direction. In this case, a piezoelectric substrate is excited according to electrical fields between the adjacent electrode fingers each having different characteristics. For this reason, as shown by broken lines in IDT 5A, the IDT is divided and a zone between the adjacent broken lines, that is, the pitch (electrode-finger width plus the inter-electrode-finger width), is considered as one unit. As arranging methods for the positive electrode and the negative electrode in the one unit sandwiched by the adjacent broken lines, as shown in FIG. 5, four arrangement modes 5B to 5E can be considered. In the arrangement 5B, when the surface-wave propagation direction is indicated by an arrow X, the positive electrodes and the negative electrodes are arranged along the surface-wave propagation direction. Here, the arrangement 5B is defined to be represented as "positive-negative". When the symbols thus defined are used, the arrangement 5C is represented by "positive-positive". Similarly, the arrangement 5D is represented by "negative-negative". Also, the arrangement 5E is represented by "negative-positive".

In the regular-type IDT, the adjacent electrode fingers are shown as one of the "positive-negative" arrangement 5B and the "negative-positive" arrangement 5E. Therefore, an elastic surface wave having the wavelength λ can be excited. The single unit in this regular-type IDT is assumed to be represented by symbol "1", disregarding that it is in either the "positive-negative" arrangement or the "negative-positive" arrangement.

When the unit "1" is in one of the "positive-positive" arrangement (arrangement 5C) and the "negative-negative" arrangement (arrangement 5A), the adjacent electrode fingers have the same potential, therefore causing no electrical field between the adjacent electrode fingers. The unit at this time is assumed to be symbol "0".

Also, in the regular-type IDT, when the "positive-negative" arrangement of the unit is replaced by the "positive-negative" arrangement, or conversely, when the "negative-positive" arrangement of the unit is replaced by the "positive-negative" arrangement, that is, when electrode reversal is performed, the electrical field between the adjacent electrode fingers has a vector opposing that of an electrical field between electrode fingers equivalent to those in the regular-type IDT. The symbol of the unit at this time is assumed to be "−1".

That is, the aforementioned symbol "1" represents "excitation", the symbol "0" represents "invalidity", and the symbol "−1" represents "cancellation".

By using the aforementioned symbols "1", "0", and "−1", the arrangements of the positive electrodes 12a and 12b can be coded.

For example, each of electrode-finger arrangements 6A to 6C shows a one-period arrangement extracted from an electrode-finger arrangement having a four-pair-period characteristic. The electrode-finger arrangement 6A is an electrode-finger arrangement of the regular-type IDT. In the above, since positive electrodes 12a and 12b are alternately arranged, every unit has the symbol "1", that is, electrical fields in all of the units contribute to excitation of surface acoustic waves.

Electrode-finger arrangement 6B is in a state where a withdrawal is performed for the electrode-finger arrangement 6A by one pair of the negative electrodes in the four-pair period, and positive electrodes are instead provided as dummy electrodes in withdrawal positions. In this case, as shown by arrangement 6B, the sequence of the symbols in one period is "1, 1, 1, 0, 0, 1, 1"; that is, "0" that does not work for excitation appears because of the withdrawal.

In the electrode-finger arrangement 6C, one pair of the positive electrode and the negative electrode is reversed in the four-pair period of the arrangement 6A. This is referred to as electrode reversal in this specification.

In this case, the sequence of symbols in the electrode-finger arrangement is "1, 1, 1, 0, −1, 0, 1, 1". Excitation is cancelled because of the aforementioned electrode reversal, thereby causing the symbol "−1" to appear. The appearance of the symbol "−1" proves that the aforementioned electrode reversal is performed.

Figure 6:
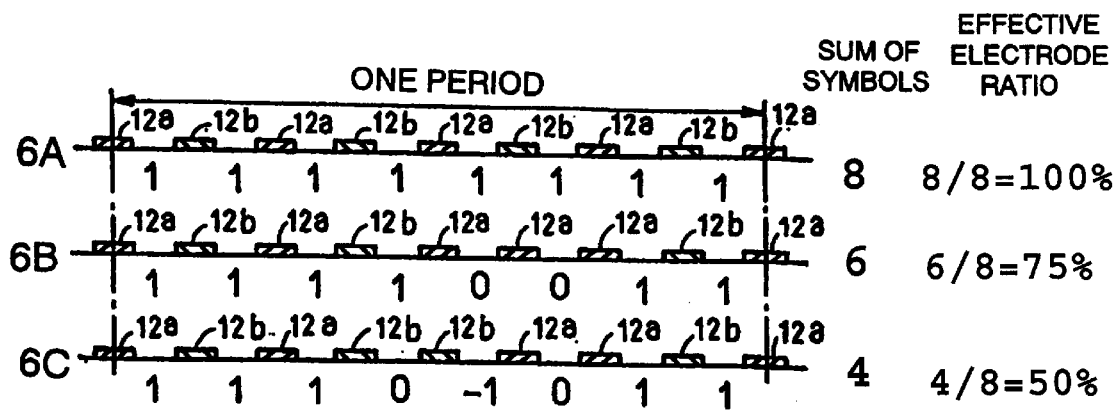
FIG. 6 is a schematic cross-sectional view explaining coding of electrode-finger arrangements in the IDT and an effective electrode ratio thereof.

As described above, according to coding of the adjacent electrode fingers in the IDT as one unit, the sum of the symbols of the individual units when one IDT is decomposed into individual units represents the number of units that actually resonate in the IDT (which is referred to as the number of active units, hereinbelow). The individual electrode-finger arrangements in FIG. 6 are referred to as examples. In the electrode-finger arrangement of the regular-type IDT 6A, the sum of the symbols per one period is eight, in which the number of the active units is eight; that is, all the eight units contribute to generation of surface acoustic waves. In the electrode-finger arrangement 6B, the withdrawal by one pair of the electrode fingers is performed, in which the sum of the symbols is six; that is, the number of the active units is six. In the electrode-finger arrangement 6C, the electrode reversal is performed for one pair of the electrode fingers, in which the number of the active units is four.

As described above, in this specification, the ratio of the number of active units to the total number of units in the IDT is defined as an effective-electrode ratio. According to presentation in the effective-electrode ratio, the electrode-finger arrangement 6A has an effective-electrode ratio of 100%, the electrode-finger arrangement 6B has an effective-electrode ratio of 75%, and the electrode-finger arrangement 6C has an effective-electrode ratio of 50%.

Effective-electrode ratios calculated using the aforementioned coding are shown for the electrode-finger arrangements 20A to 20F in FIGS. 2A to 2F and in the electrode-finger arrangements 20G to 20L in FIGS. 3A to 3F. FIGS. 2 and 3 identifies the positive electrodes 12a and 12b by showing them using hatched lines having opposite directions (refer to FIG. 2A).

Referring back to FIG. 1, the electrode-finger arrangement in the IDT 6 in the composite SAW filter is equivalent to the electrode-finger arrangement 20J in FIG. 3D, in which the effective-electrode ratio is about 25%.

In the description regarding the above coding, random-sequential arrangements of the positive electrodes and the negative electrodes are quantitatively handled, and also, approximation is performed in order to clarify preferred embodiments of the present invention. More specifically, even the adjacent units each having the symbol "0" generate some electrical fields, thereby contributing to generation of surface acoustic waves. On the other hand, even the adjacent electrode fingers in the units each having the symbol "−1" do not simply perform complete cancellation of excitation, but generate complicated electrical-field distribution. Therefore, even the electrode-finger arrangements each having the same effective-electrode ratio cause the IDT to provide different characteristics depending on application of the withdrawal and the electrode reversal. However, the aforementioned approximation is considered to be still advantageous in clarification of the configuration of preferred embodiments of the present invention, and also, to be advantageous in description of advantages that can be obtained from the configuration of preferred embodiments of the present invention.

Hereinbelow, a description will be provided of operational advantages produced when the effective-electrode ratio is reduced by performing the above-described withdrawal and the electrode reversal for the IDTs.

As described above, FIGS. 2A to 2F and FIGS. 3A to 3F are views of various electrode-finger arrangements in the IDTs. The electrode-finger arrangement 20A is an electrode-finger arrangement in the regular-type IDT, in which the effective-electrode ratio is 100%. For the electrode-finger arrangement 20B in FIG. 2B, the withdrawal is performed, thereby reducing the effective-electrode ratio to about 75%. For the electrode-finger arrangement 20C, the electrode reversal is performed, thereby reducing the effective-electrode ratio to about 75%. Similarly, for the electrode-finger arrangements 20D, 20F, 20G, 20I, and 20K, the withdrawal is performed, thereby reducing the individual effective-electrode ratios. On the other hand, for the electrode-finger arrangements 20E, 20H, 20J, and 20L, the electrode reversal is performed, thereby reducing the individual effective-electrode ratios.

Figure 7:
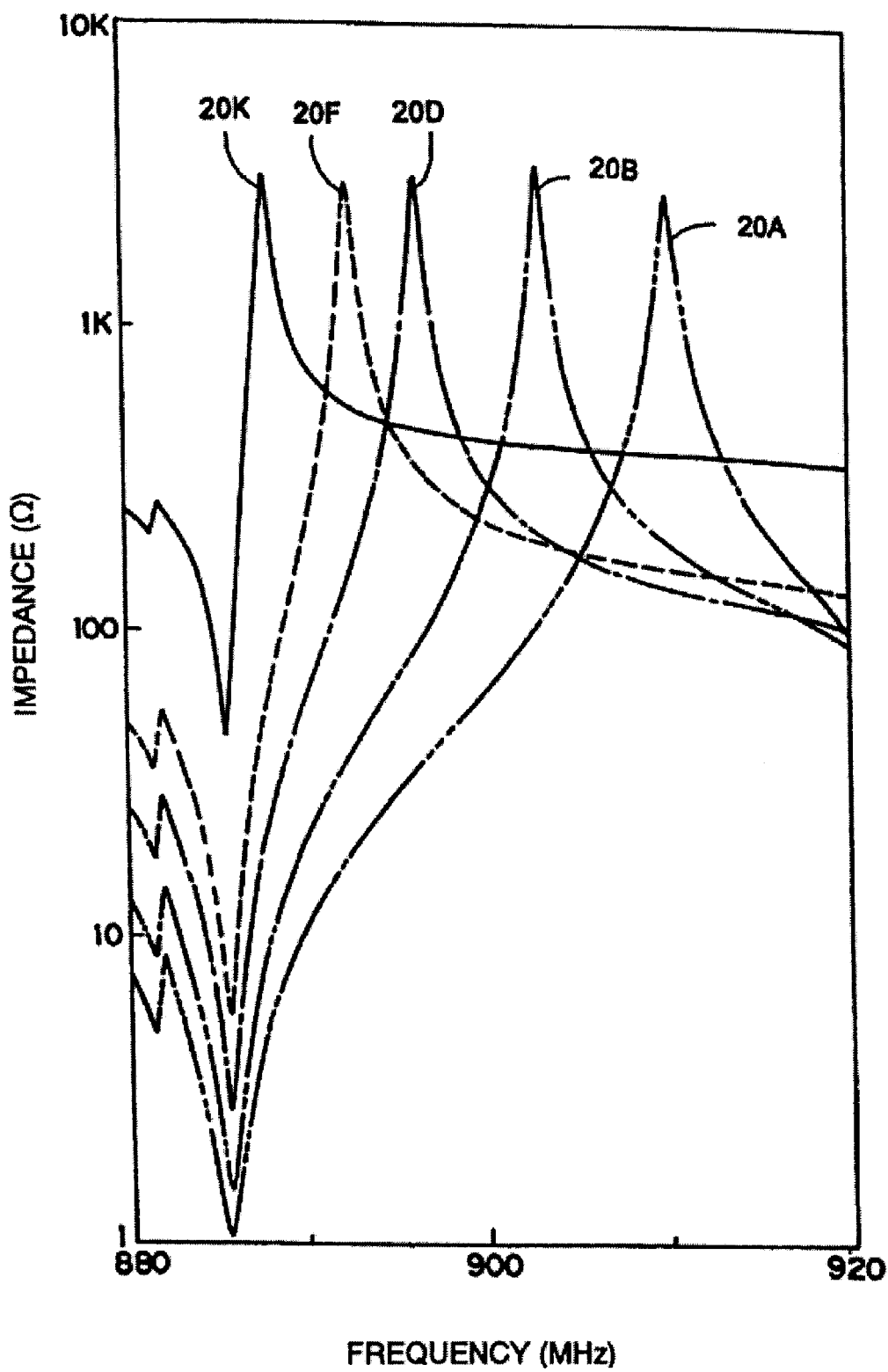
FIG. 7 is a graph showing impedance-frequency characteristics of a SAW resonator when an electrode-finger arrangement is changed by a withdrawal method.
Figure 8:
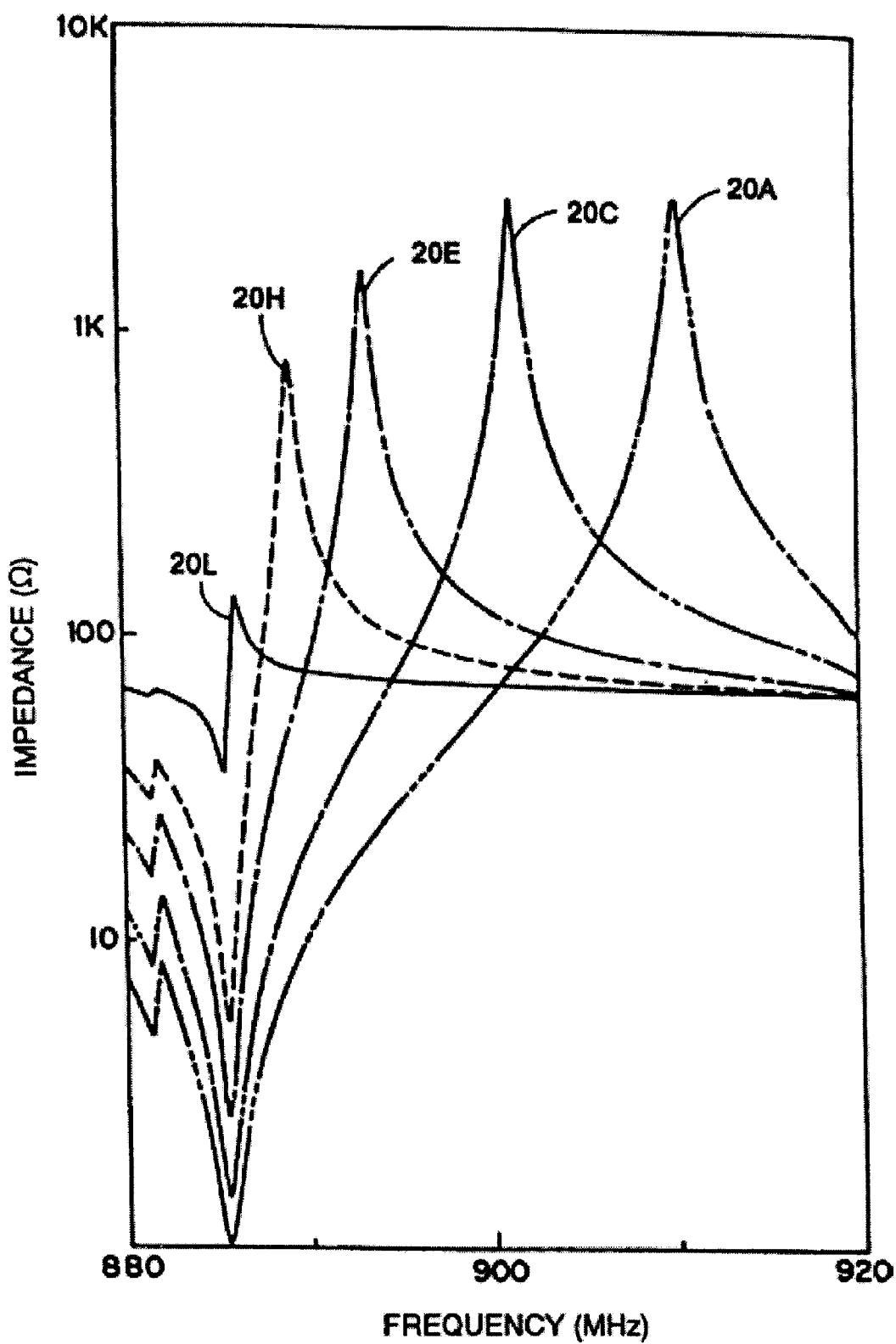
FIG. 8 is a graph showing impedance-frequency characteristics of the SAW resonator when the electrode-finger arrangement is changed by an electrode reversal method.

FIGS. 7 and 8 show impedance characteristics of individual SAW resonators including an IDT actually having the electrode-finger arrangements. In FIGS. 7 and 8, characteristics of IDTs having electrode-finger arrangements 20A to 20L are shown with symbols 20A to 20L, respectively, thereby allowing quick comparison with FIGS. 2 and 3.

In the individual impedance characteristics shown in FIGS. 7 and 8, for each electrode-finger arrangement, the number of electrode fingers of the IDTs is 80, and each cross width is preferably about 80 $\mu$m.

As is apparent in FIGS. 7 and 8, in each case where the one of the withdrawal and the electrode reversal is performed, although an antiresonant frequency decreases according to reduction in the effective-electrode ratio, a resonant frequency remains unchanged. That is, the frequency interval between the resonant frequency and the antiresonant frequency can be reduced by reducing the effective-electrode ratio without changing the resonant frequency. Therefore, according to adjustment of the effective-electrode ratio by performing one of the withdrawal and the electrode reversal, the frequency interval between the resonant frequency and the antiresonant frequency can be adjusted without changing the resonant frequency.

Figure 9:
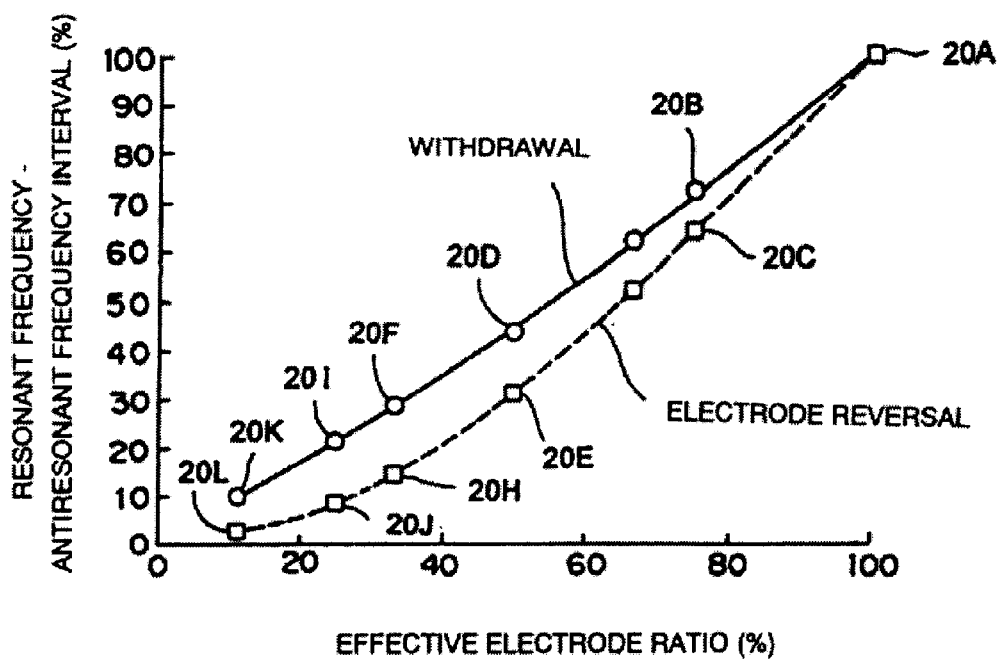
FIG. 9 is a graph showing relationships between frequency intervals between resonant frequencies and antiresonant frequencies.

As a result of plotting for each of the aforementioned effective-electrode ratios, FIG. 9 shows each ratio of the frequency interval of the resonant frequency between the antiresonant frequency in each of the individual impedance characteristics to each of the frequency interval between the resonant frequency and the antiresonant frequency in the regular-type IDT. As is apparent in FIG. 9, the electrode reversal allows the frequency interval between the resonant frequency and the antiresonant frequency to be reduced more efficiently than in the case of the withdrawal.

Figure 10:
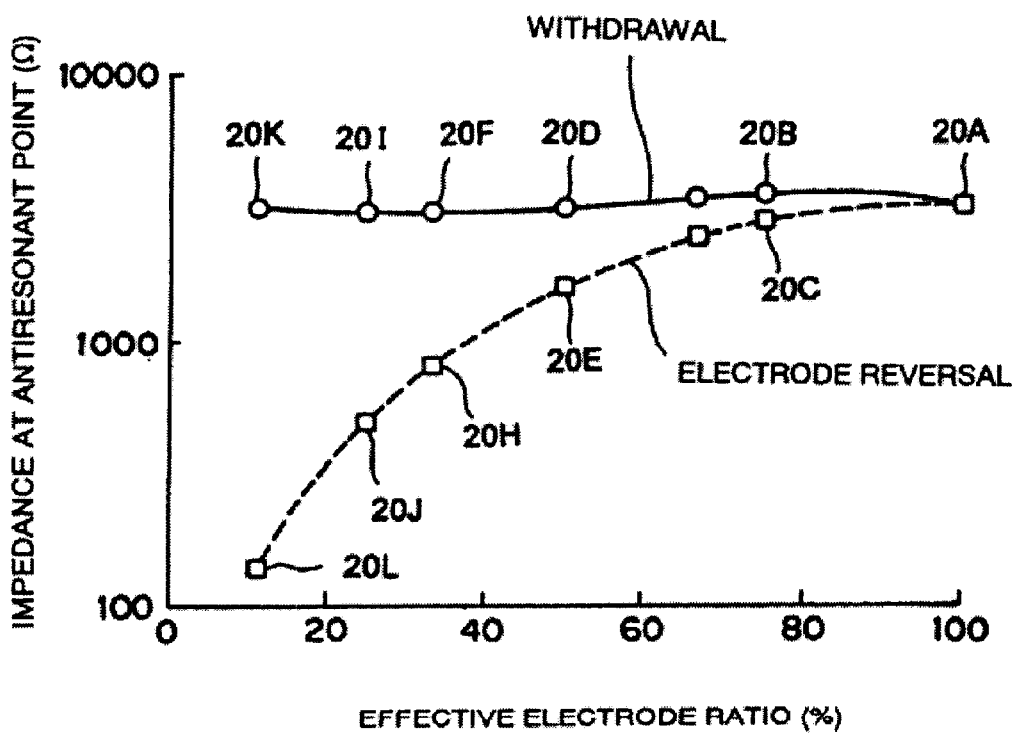
FIG. 10 is a graph showing relationships between impedances and effective-electrode ratios in antiresonant points.

FIG. 10 shows relationships between impedances at antiresonant points in the individual impedance characteristics shown in FIGS. 7 and 8 and the effective-electrode ratios. As is apparent in FIG. 10, the withdrawal causes impedance at each of the antiresonant points substantially to remain unchanged, whereas the electrode reversal causes significant reduction in the impedance in proportion to reduction in the effective-electrode ratio.

Figure 11:
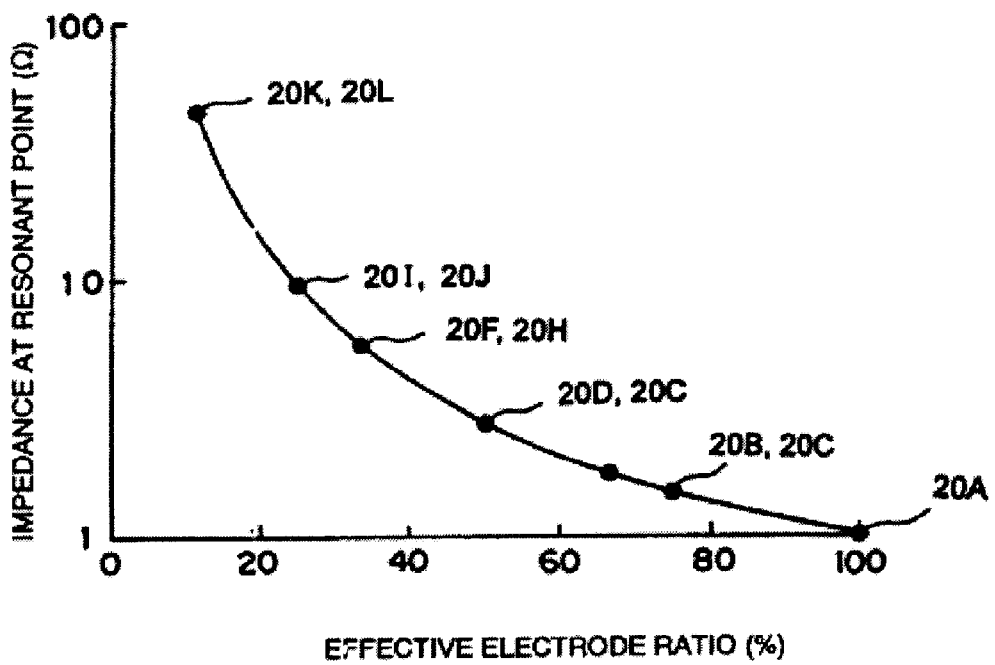
FIG. 11 is a graph showing relationships between impedances and effective-electrode ratios in resonant points.

FIG. 11 shows relationships between impedances at resonant points in the individual impedance characteristics shown in FIGS. 7 and 8 and the effective-electrode ratios. As is apparent in FIG. 11, the impedances at resonant points are the same in the both cases of the withdrawal and the electrode reversal, and individual impedances at resonant points causes increase in inverse proportion to reduction in the effective-electrode ratio.

As is apparent in FIGS. 2 and 3, the individual impedance characteristics of the electrode-finger arrangements 20B, 20D, 20F, and 20K that are shown in FIG. 7 represent arrangements in which the withdrawal is performed for positive electrodes, and negative electrodes are provided as dummy electrodes in the withdrawal positions. That is, every unit with the symbol "0" is arranged in a "negative-negative" state.

According to the withdrawal in the electrode-finger arrangement 20G, units with the symbol "0" include both "negative-negative" units and "positive-positive" units. That is, although the effective-electrode ratio in the electrode-finger arrangement 20G is about 33% that is the same as that of the electrode-finger arrangement 20F, and also, the symbols are similarly composed of combinations of "1" and "0", the contents of units with the symbol "0" are different.

According to the impedance characteristic of the aforementioned electrode-finger arrangement 20G, the frequency interval between the resonant frequency and the antiresonant frequency is smaller than in the case of the electrode-finger arrangement 20F, and the impedance at the antiresonant point is reduced. Therefore, the characteristic of the electrode-finger arrangement is similar to the characteristic of the electrode-finger arrangement 20H in which the effective-electrode ratio is about 33% because of the electrode reversal. Thus, even when the same effective-electrode ratio is obtained using only the withdrawal, the characteristic is still variable depending on the arrangement of the symbols of the units.

As described with reference to the above examples, however, since the variation is not significant, the operation that reduces the frequency interval between the resonant frequency and the antiresonant frequency according to preferred embodiments of the present invention substantially remains unchanged.

For electrode-finger arrangements of the positive electrodes and the negative electrodes in IDTs, as shown in FIGS. 2A to 2F and FIGS. 3A to 3F, the above description has used arrangements each having the periodical regularity with respect to the withdrawal or the electrode reversal so as to be quickly understood. However, the operation for reducing the frequency interval between the resonant frequency and the antiresonant frequency according to the reduction in the effective-electrode ratio is not restricted to one of the withdrawal and the electrode reversal. Also, the arrangement is not restricted to those having the periodical regularity. For example, both the withdrawal and electrode reversal may be randomly included. A characteristic at this time is intermediate between the characteristic of the electrode-finger arrangement for which the withdrawal is performed and the electrode-finger arrangement for which the electrode reversal is performed, which are shown in FIG. 9.

Also, the arrangement of the positive electrodes and the negative electrodes need not always be periodical. The frequency interval between the resonant frequency and the antiresonant frequency always depends on the number of active units in the total number of units, that is, the effective-electrode ratio. For example, even when the sequence of the symbols of electrode-finger arrangements in the IDT is arranged at a full random, as in "1, 1, 0, −1, −1, 0, 1, 1, 1, 0, 0, 1, 0, 0, 1, 0, −1, −1, 0 . . . ", the frequency interval between the resonant frequency and the antiresonant frequency is reduced substantially in proportion to the above-described effective-electrode ratio.

Also, no problems occur even when completely different electrode-finger arrangements are combined in a single IDT. For example, even when an electrode-finger arrangement in an approximately central portion of the IDT is arranged as in the electrode-finger arrangement 20B (effective-electrode ratio of about 75%), and an outer IDT portion therearound is arranged as in the electrode-finger arrangement 20H (effective-electrode ratio of about 33%), the frequency interval between the resonant frequency and the antiresonant frequency is reduced in proportion to the effective-electrode ratio on the entire basis.

Figure 12:
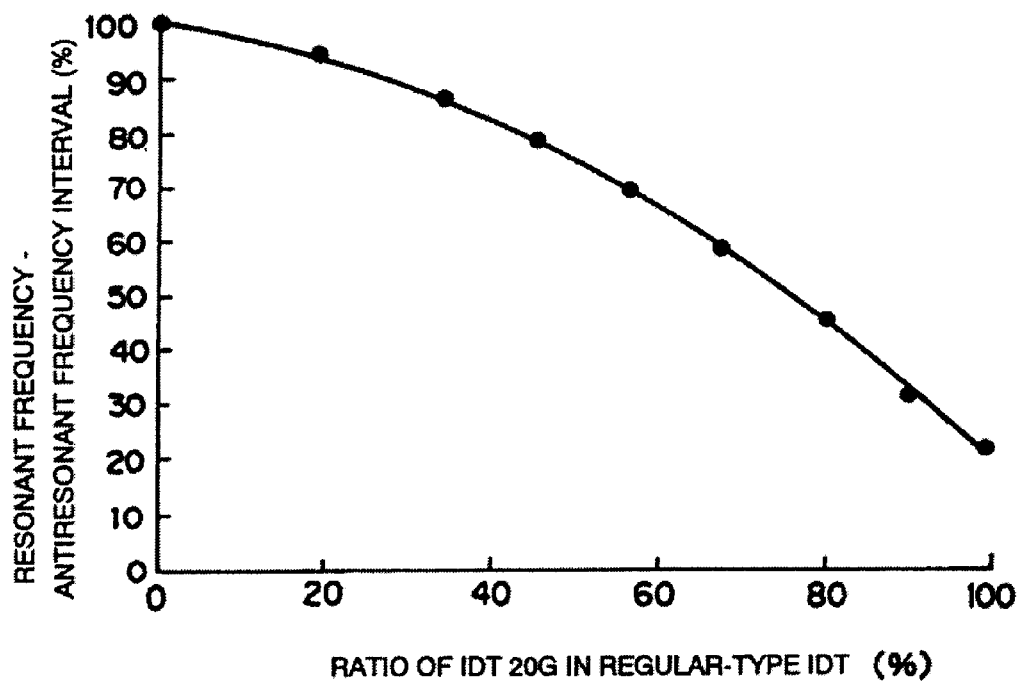
FIG. 12 is a graph showing relationships between frequency intervals between resonant frequencies and antiresonant frequencies and ratios of an electrode-finger arrangement 20G in the IDT.

FIG. 12 is a graph showing the relationship between the frequency interval between the resonant frequency and the antiresonant frequency and the ratio of an area where the electrode-finger arrangement 20G is provided when an electrode-finger arrangement in an approximately central portion of the IDT is arranged as in the aforementioned electrode-finger arrangement 20G (FIG. 3A; effective-electrode ratio of about 33%), and an outer IDT portion therearound is arranged as in the electrode-finger arrangement for the regular-type IDT (effective-electrode ratio of about 100%). The ratio of the area where the electrode-finger arrangement 20G is provided refers to the ratio of an area where the configuration is made according to the electrode-finger arrangement 20G in the entire IDT; 0% on the horizontal axis represents that the entire portion is used by the regular-type IDT; and 100% represents that the entire IDT is configured of the electrode-finger arrangement 20G.

As is apparent in FIG. 12, according to the ratio of the electrode-finger arrangement 20G, the frequency interval between the resonant frequency and the antiresonant frequency varies. More specifically, the ratio is reduced as the ratio of the electrode-finger arrangement 20G becomes greater.

Also, according to the above description, when the withdrawal is performed, electrode fingers having the polarity that is opposite to the polarity of the electrodes subjected to the withdrawal are provided as dummy electrodes in the withdrawal portion. If the electrode fingers subjected to the withdrawal were simply removed, acoustic velocity of the elastic surface would vary at the withdrawal position, thereby causing a deviation in phase of the elastic surface wave. The dummy electrode is provided so as to prevent adverse influence due to the deviation in phase, of which method has been already described.

Figure 13A:
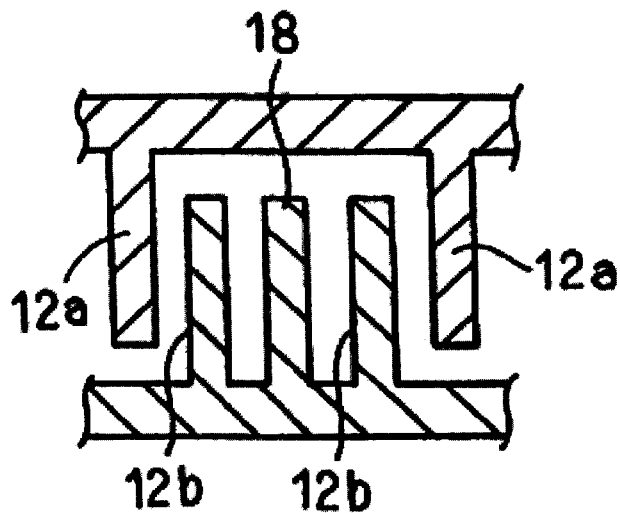
FIGS. 13A to 13C are, individually, partial cross-section views used to explain an electric pattern according to a method for the withdrawal.
Figure 13B:
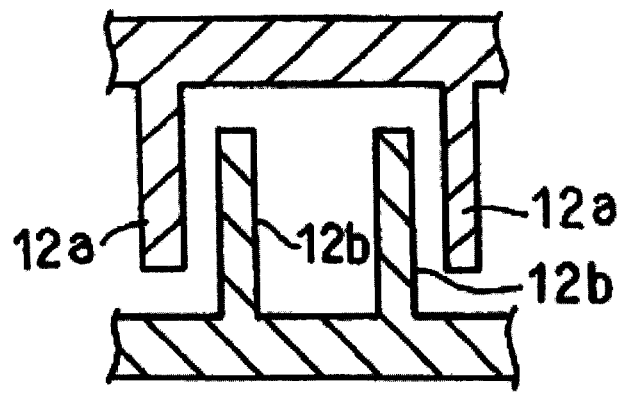
Figure 13C:
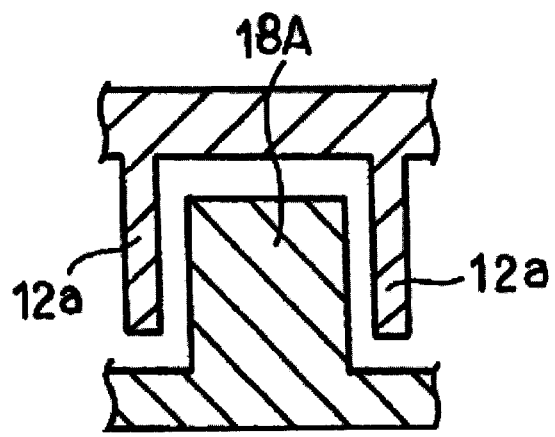

As shown in FIG. 13A, a dummy electrode 18 may be provided at the withdrawal position. Alternatively, as shown in FIG. 13B, the dummy electrode 18 may be omitted leaving the withdrawal portion with no electrode finger. Also, as shown in FIG. 13C, the withdrawal portion may be metalized to allow an electrode finger 18A having a large width to be formed. The above-described operation for reducing the frequency interval between the resonant frequency and the antiresonant frequency can be obtained regardless of use of the dummy electrode in the withdrawal. Therefore, even with the withdrawal methods, reducing the effective-electrode ratio allows the frequency interval between the resonant frequency and the antiresonant frequency to be greatly reduced.

Also, the 36-degree Y-cut X-propagation $LiTaO_3$ is used for the piezoelectric substrate 8. However, even with a different piezoelectric substrate, the effective-electrode ratio can be greatly reduced similarly to the above, thereby allowing the frequency interval between the resonant frequency and the antiresonant frequency to be greatly reduced.

Hereinbelow, a description will be provided of characteristics of the composite SAW filter of a first preferred embodiment of the present invention.

Figure 14:
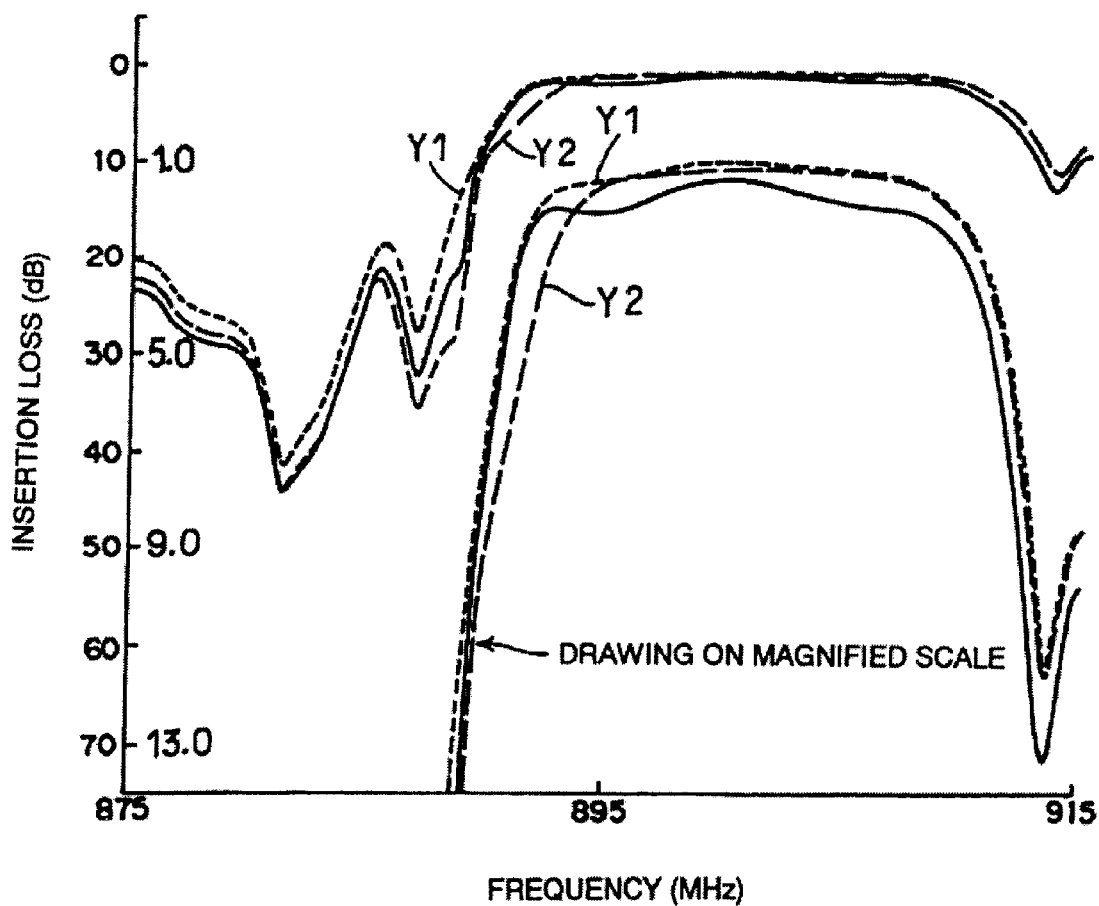
FIG. 14 is a graph showing frequency-amplitude characteristics of a composite SAW filter of a first preferred embodiment of the present invention, a simple substance of the SAW-filter, and a first conventional example composite SAW filter.

FIG. 14 uses solid lines to show frequency characteristics of the composite SAW filter of the first preferred embodiment of the present invention. To allow comparison, the figure uses a broken line Y1 to show characteristics of the simple substance of the SAW filter 1 included in the first preferred embodiment. Also, the figure uses broken lines Y2 to show characteristics of the conventional composite SAW filter as a first conventional example (characteristics shown in FIG. 25). The drawing in an enlarged scale is enlarged according to the scale on the right side of the vertical axis.

Figure 15:
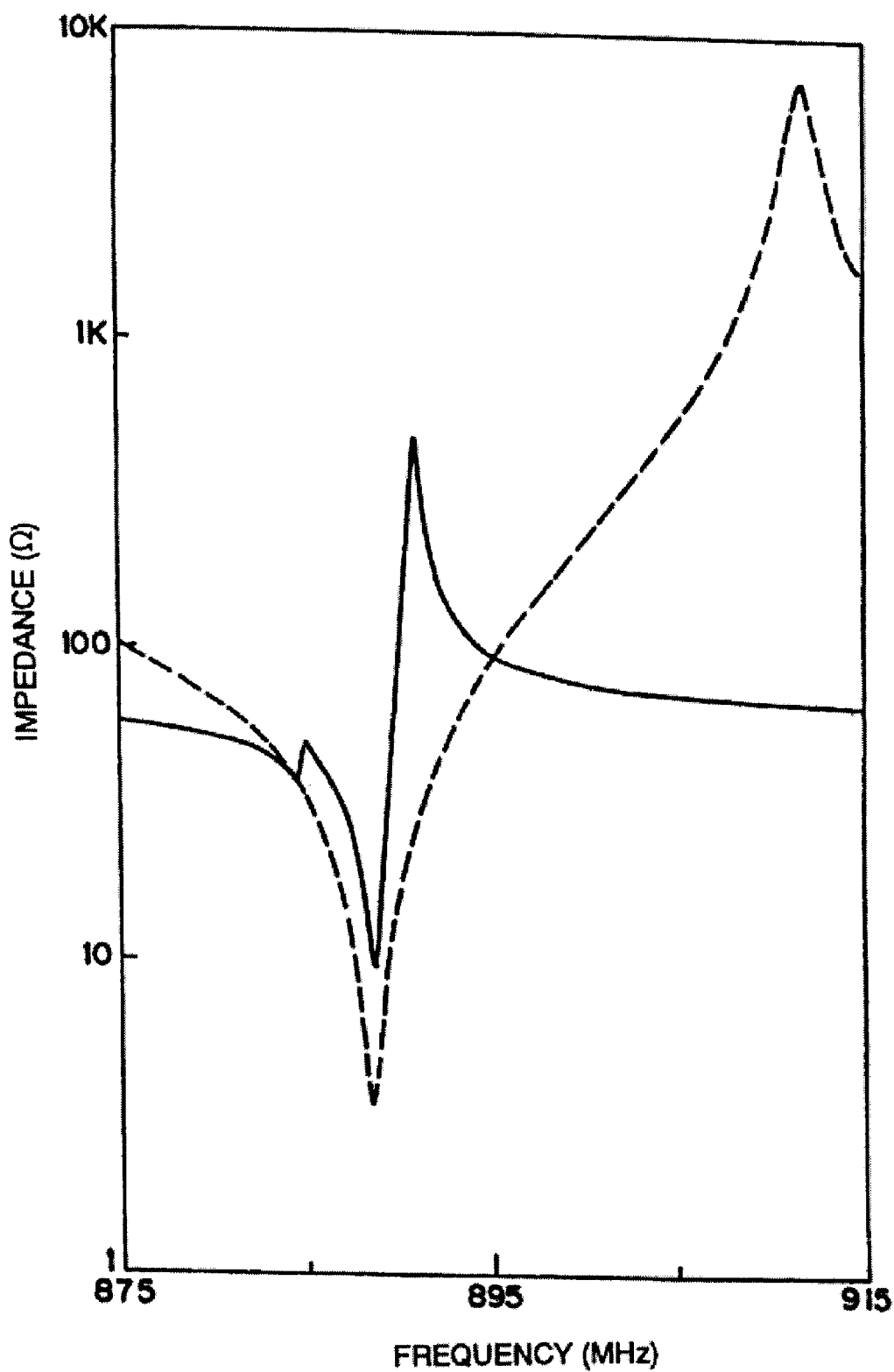
FIG. 15 is a graph showing impedance-frequency characteristics of a SAW resonator used in the first preferred embodiment and a SAW resonator used in the first conventional example.
Figure 25:
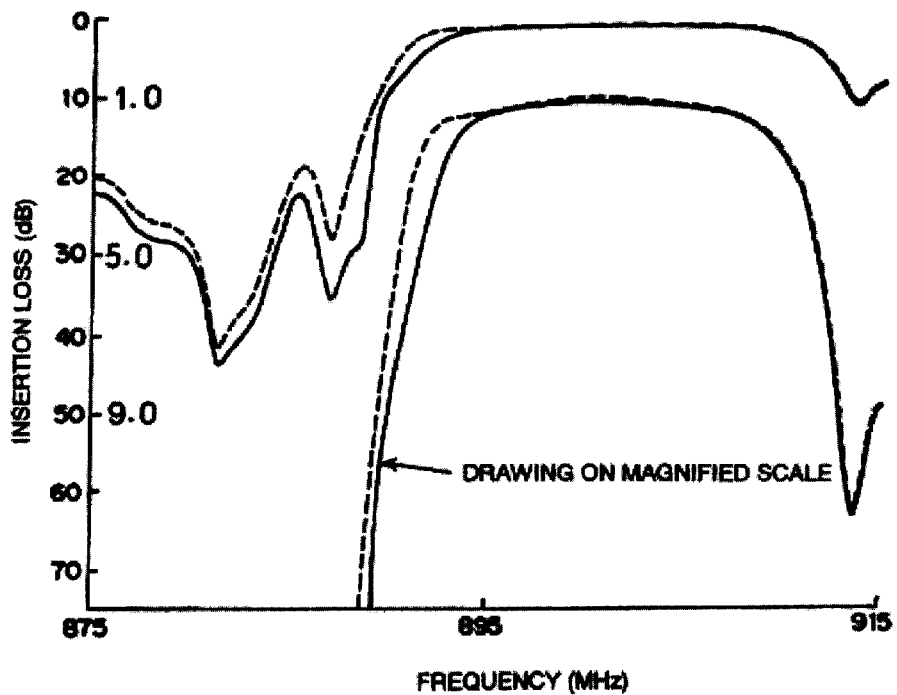
FIG. 25 is a graph showing a frequency-amplitude characteristic of the composite SAW filter according to the first conventional example.

Also, FIG. 15 shows an impedance-frequency characteristic (solid line) of the SAW resonator 2, and an impedance-frequency characteristic (broken line) of the SAW resonator having the regular-type IDT, which is used in the first conventional example of the SAW filter shown in FIG. 25.

As described above, in the first conventional example of the SAW filter shown in FIG. 25, the SAW resonator having the characteristic indicated by the broken line is electrically connected in parallel to the SAW filter so that the amount of attenuation in the vicinity of the low-band side of the passband increases. Even in this case, the filter characteristic indicated by the broken line Y2 in FIG. 14 can be obtained. As described above, however, although the amount of attenuation is increased on the low frequency side from the position where the amount of attenuation on the low-band side of the passband is 10 dB, the low-band side of the passband is decreased because of influence of the low impedance of the resonant frequency in the SAW resonator.

In the composite SAW filter of this preferred embodiment invention, the SAW resonator 2 having the impedance characteristic indicated by the solid line in FIG. 15 is connected in parallel to the SAW filter 1. In this case, the amount of attenuation in the vicinity of the low-band side of the passband is similar to that of the conventional SAW filter. That is, the resonant frequency in the SAW resonator 2 is adjusted to the vicinity that is very close to the low-band side of the passband. Thereby, as indicated by the solid line in FIG. 14, the amount of attenuation on the low-band side of the passband increases from the position where the amount of attenuation on the low-band side of the passband is about 10 dB. In addition, this preferred embodiment is improved regarding the decrease on the low-band side of the passband, which is a defect in the first conventional example. Also, the preferred embodiment is capable of producing characteristics on the low-band side of the passband, which are close to characteristics of the simple substance of the SAW filter 1. This is because the effective-electrode ratio in the SAW resonator 2 is reduced to allow the adjustment of the antiresonant frequency in the SAW resonator to the low-band side of the passband, thereby significantly increasing impedance of the SAW resonator 2 at the frequency in the low-band side of the passband, whereby the influence on the low-band side of the passband of a filter in the SAW resonator 2 is reduced.

In FIG. 14, when sharpness on the low-band side of the passband is determined at the frequency interval at positions of attenuation levels of about 3 dB and about 20 dB, it is about 3.3 MHz for the simple substance of the SAW filter 1. While it is 3.6 MHz for the conventional SAW filter, it is about 2.5 MHz for this preferred embodiment, thus achieving a significant improvement in the sharpness.

From the above, it is clear that electrical connection in parallel of the SAW resonator of this preferred embodiment of the present invention, which is capable of reducing the effective-electrode ratio, to the SAW filter of preferred embodiments of the present invention achieves advantages that are unachievable with the conventional SAW filter. These advantages include obtaining very large amounts of attenuation very close to the low-band side of the passband and to obtain preferable insertion losses in the passband. According to the above, the sharpness of the filter characteristics of the low-band side of the passband are efficiently increased.

The first preferred embodiment uses effects of reduction in the frequency interval between the resonant frequency and the antiresonant frequency in the SAW resonator 2 according to the reduction in the effective-electrode ratio in the above-described SAW resonator 2. These effects are significant, especially when the frequency interval between the resonant frequency and the antiresonant frequency is about 30% or less of the frequency interval between the resonant frequency and the antiresonant frequency in the regular-type IDT.

However, when the frequency interval between the resonant frequency and the antiresonant frequency is about 5% or less, the difference between impedances of the resonant point and the antiresonant point excessively decreases. This disables sufficiently large amounts of attenuation to be obtained, and in addition, increases the influence on the pass band. For these reasons, for the first preferred embodiment, the frequency interval between the resonant frequency and the antiresonant frequency in the SAW resonator 2 is preferably controlled so as to be within a range of about 5% to about 30% of the frequency interval between the resonant frequency and the antiresonant frequency in the regular-type IDT. Also, from FIG. 9, it can be known that the effective-electrode ratio should be controlled so as to be within a range of about 10% to about 50% to control the frequency interval between the resonant frequency and the antiresonant frequency so as to be within the range of about 5% to about 30%.

Figure 16:
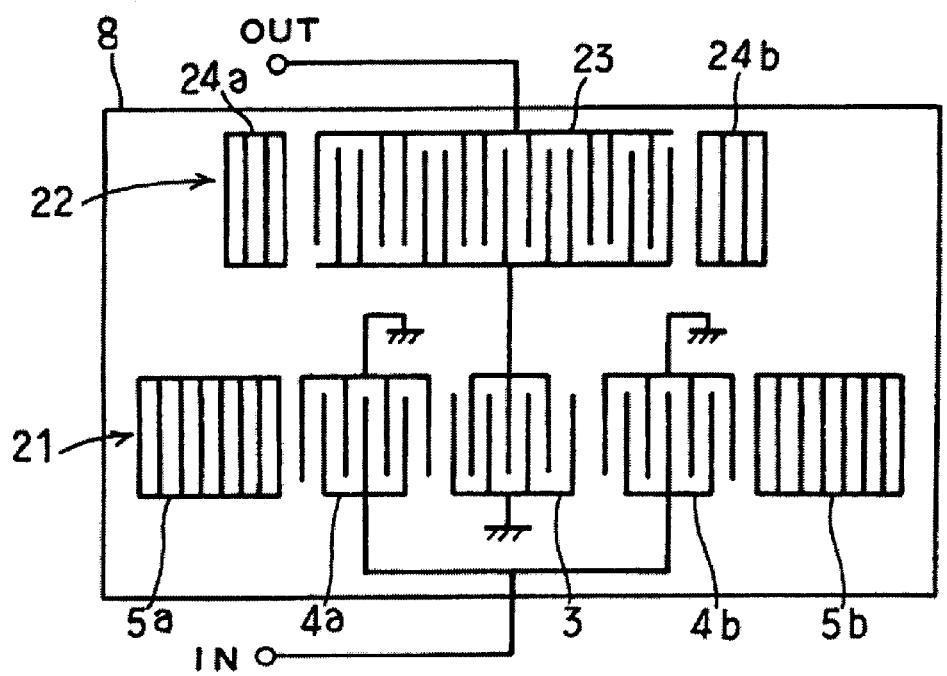
FIG. 16 is a schematic plan view showing electrode structures in a composite SAW filter of a second preferred embodiment.

FIG. 16 is an outline configuration view showing an electrode structure of a composite SAW filter according to a second preferred embodiment of the present invention. In the second preferred embodiment, electrode structures in a SAW filter 21 and a SAW resonator 22 are preferably made of Al materials on a piezoelectric substrate 8 formed of a 36-degree Y-cut X-propagation $LiTaO_3$.

The SAW resonator 22 is preferably configured similar to the SAW resonator 2 used in the first preferred embodiment. Differences from the SAW resonator 2 include pitches of IDTs and reflectors.

The SAW resonator 22 is connected to the output terminal of the SAW filter 21. In this preferred embodiment also, the input end and the output end of the SAW filter 21 may be interchanged.

Also, similar to the first preferred embodiment, design conditions of the SAW filter 21 may be optionally changed so that desired filter characteristics can be achieved.

Each cross width in the IDT of the SAW resonator 22 is preferably about 180 $\mu$m, and the configuration is made so as to have an impedance characteristic that is lower than that of the SAW resonator 21.

Each pitch (electrode-finger width plus the inter-electrode-finger width) of an IDT 23 and reflectors 24a and 24b in the SAW resonator 22 is arranged to be about ½ of a wavelength of an elastic surface wave that is excited at desired frequencies.

Also, similar to first preferred embodiment, in the SAW resonator 22, the effective-electrode ratio in the IDT 23 is reduced according to one of the withdrawal and the electrode reversal.

Figure 17:
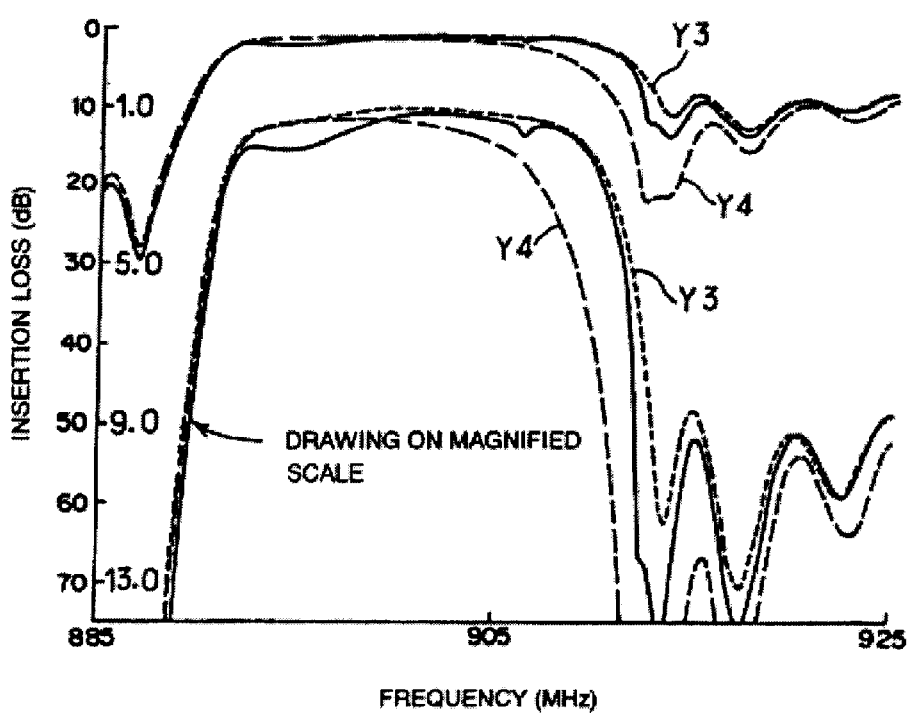
FIG. 17 is a graph showing frequency-amplitude characteristics of the composite SAW filter of the second preferred embodiment, a simple substance of the SAW-filter, and a second conventional example composite SAW filter.
Figure 26:
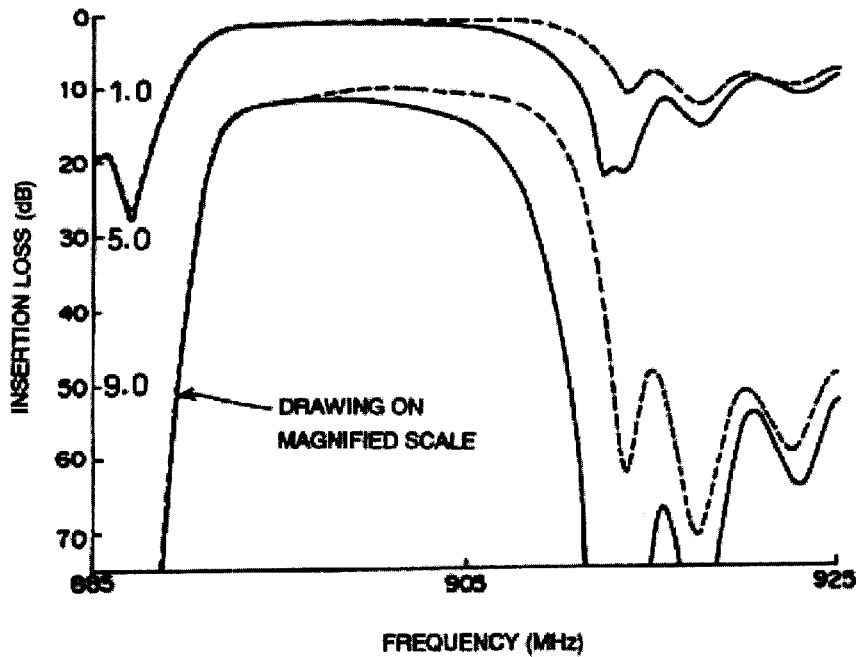
FIG. 26 is a graph showing a frequency-amplitude characteristic of the composite SAW filter according to the second conventional example.

FIG. 17 shows a frequency-amplitude characteristic (solid lines) of the composite SAW filter according to the second preferred embodiment, a frequency-amplitude characteristic (broken line Y3) of a simple substance of the SAW filter 21, and a frequency-amplitude characteristic (broken line Y4) of a second conventional composite SAW filter having the characteristics shown in FIG. 26.

Figure 18:
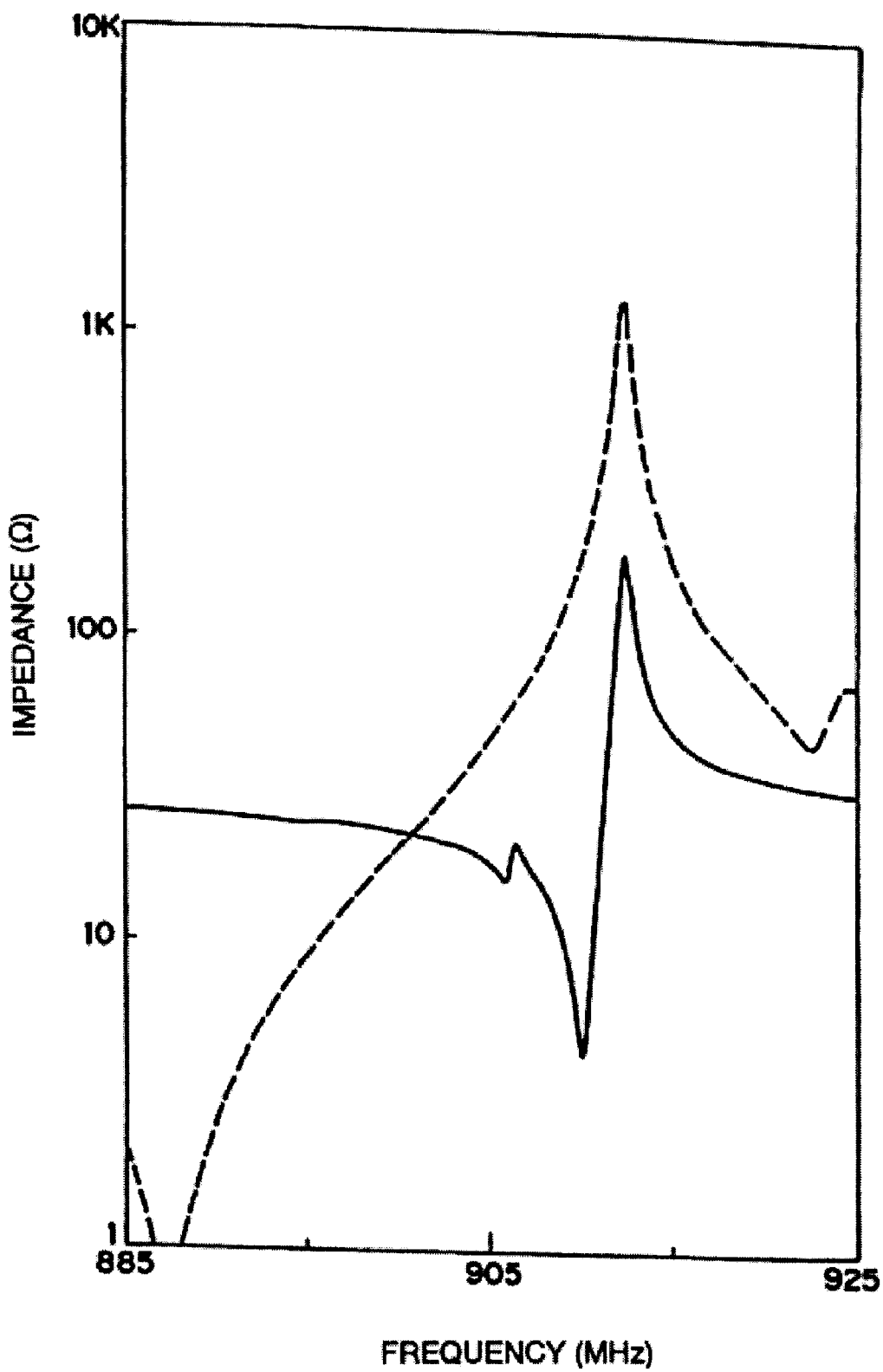
FIG. 18 is a graph showing impedance-frequency characteristics of a SAW resonator used in the second preferred embodiment and a SAW resonator used in the second conventional example.

FIG. 18 uses a solid line to show an impedance characteristic of the SAW resonator 22 included in the second preferred embodiment, and uses a broken line to show an impedance characteristic of the SAW resonator including a regular-type IDT, which is used in the second conventional example.

As shown in FIG. 17, in the second conventional composite SAW filter, the SAW resonator having the characteristic indicated in the broken line in FIG. 18 is electrically series-connected to the SAW filter to improve the amount of attenuation in the vicinity of the high-band side of the passband. In this case, as is apparent in FIG. 18, the amount of attenuation in the vicinity of 913 MHz is increased. However, since the SAW resonator having the characteristics shown by the broken line in FIG. 18, influence of a high impedance of an antiresonant frequency in the SAW resonator exerts over the high-band side of the passband which has filter characteristics. This causes the high-band side of the passband to be significantly decreased.

In the composite SAW filter of the second preferred embodiment, the aforementioned SAW resonator 22 is electrically series-connected to the SAW filter 21. By adjusting the antiresonant frequency in the SAW resonator 22 so as to be very close to the high-band side of the passband, as shown by the solid lines in FIG. 17, the amount of attenuation in the vicinity of the high-band side of the passband increases greater in the vicinity of 913 MHz on the high-band side of the passband than in the case of the characteristic of the simple substance of the SAW filter 21 while it does not reach the level of the second conventional example.

In addition, this preferred embodiment is improved regarding the decrease on the high-band side of the passband. That is, filter characteristics which are close to the characteristics of the simple substance of the SAW filter 21 are available in the high-band side of the passband. This is attributed to that the resonant frequency in the SAW resonator 22 in which the effective-electrode ratio is small is adjusted to the high-band side of the passband of the filter characteristics. This significantly decreases impedance of the SAW resonator 22 at the frequency in the high-band side of the passband, thereby reducing the influence according to the SAW resonator 22 on the high-band side of the passband of the filter characteristics.

As described above, according to electrical connection performed in series for the SAW resonator of various preferred embodiments of the present invention to the SAW filter of preferred embodiments of the present invention, many advantages that are unachievable by the conventional method can be achieved. Such advantages include obtaining large amounts of attenuations in the vicinity that is very close to the high-band side of the passband and to obtain preferable insertion losses in the passband. According to the above, the sharpness on the high-band side of the passband is greatly increased.

As in the case of the first preferred embodiment, the frequency interval between the resonant frequency and the antiresonant frequency is preferably controlled so as to be within a range of about 5% to about 30% of the frequency interval between the resonant frequency and the antiresonant frequency in the regular-type IDT. This is preferable to realize a sufficiently large amount of attenuation in the vicinity of the passband and reduction in inverse influence on the passband. Therefore, the effective-electrode ratio in the SAW resonator 22 is preferably controlled so as to be within a range of about 10% to about 50%.

A composite SAW filter of a third preferred embodiment is similar to the SAW filter of the first preferred embodiment except for electrode-finger arrangements, electrode-finger cross widths, electrode-finger pitches in the SAW resonator 2 which are modified. Therefore, a description will be provided of only the differences, and descriptions of the similar portions will be omitted while they will be shared for reference. Hereinbelow, the SAW resonator of the third preferred embodiment is referred to as a SAW resonator Z.

The SAW resonator preferably has electrode-finger arrangements shown in the electrode-finger arrangement 20E (effective-electrode ratio: 50%) shown in FIG. 2A. Each electrode-finger cross width in the SAW resonator Z is about 60 $\mu$m, and the pitch is ½ of wavelength $\lambda$ of the elastic surface wave.

As above, in this preferred embodiment, the SAW resonator Z has the effective-electrode ratio reduced to about 50%. Therefore, similarly to the SAW resonator 2 of the first preferred embodiment, the amount of attenuation on the low band side can be increased so as to be larger than that in the passband, and the insertion loss can be greatly improved.

Figure 19:
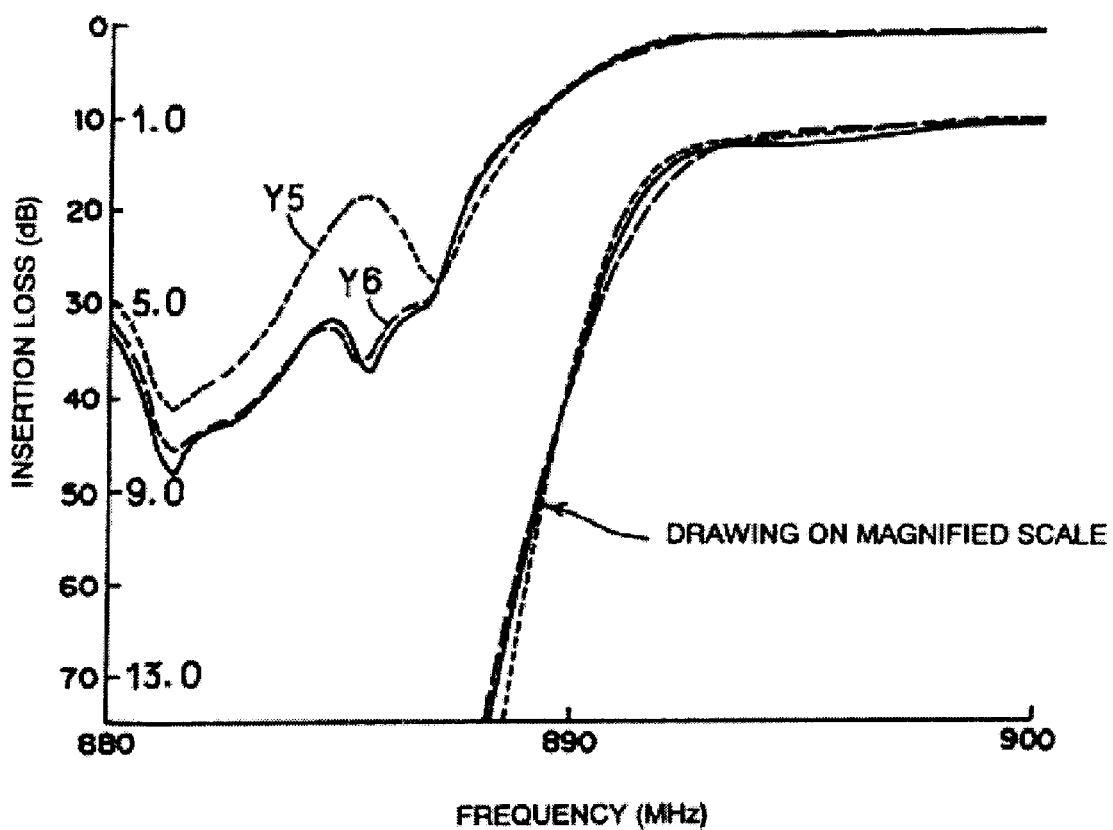
FIG. 19 is a graph showing frequency-amplitude characteristics of a composite SAW filter of a third preferred embodiment, a simple substance of the SAW-filter, and a third conventional example composite SAW filter.

FIG. 19 uses solid lines to show a frequency-amplitude characteristic of the composite SAW filter of the third preferred embodiment, and uses broken line Y5 to show a frequency-amplitude characteristic of the simple substance of the SAW filter 1 used in the third preferred embodiment. Also, the figure uses a broken line Y6 to show a frequency-amplitude characteristic of a third conventional example SAW filter configured similarly to the first preferred embodiment except that a conventional SAW resonator formed by using the regular-type IDT is used. Also, FIG. 20 shows an impedance characteristic (solid line) of the SAW resonator Z used in the third preferred embodiment and an impedance characteristic (broken line) of the SAW resonator used in the third conventional example.

As is apparent in FIG. 19, the simple substance of the SAW filter 1 contains spurious components in frequency bands in a range of about 884 MHz to about 887 MHz. The third preferred embodiment improves the level of amounts of attenuations in these frequency bands.

Figure 20:
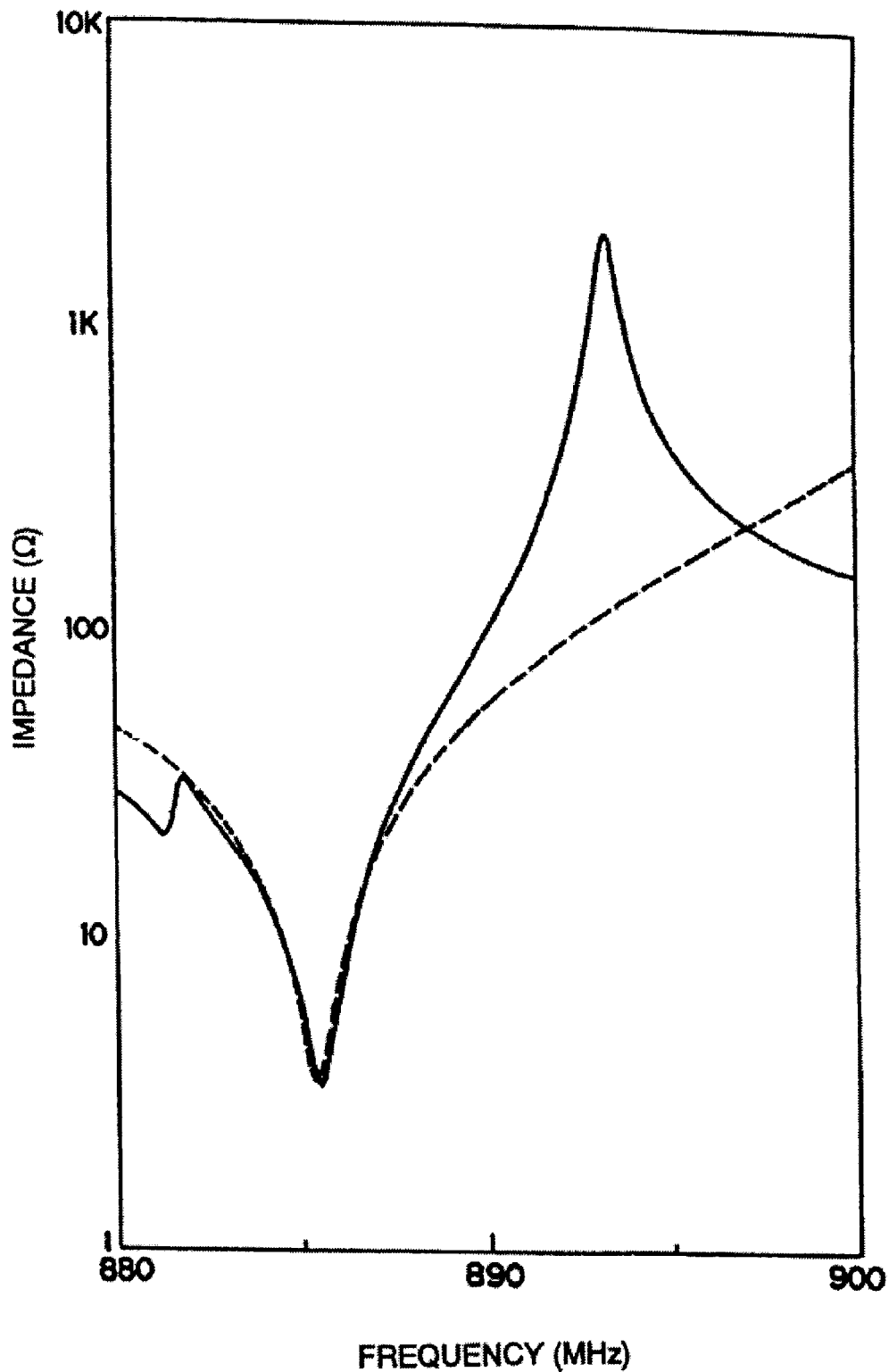
FIG. 20 is a graph showing impedance-frequency characteristics of a SAW resonator used in the third preferred embodiment and a SAW resonator used in the third conventional example.

As shown in FIG. 19, in the third conventional example, to increase amounts of attenuations in the aforementioned frequency bands, the SAW resonator having the characteristic indicated by the broken line in FIG. 20 is electrically connected in parallel to the SAW filter 1. Thereby, as shown in FIG. 19, although the amount of attenuation in a desired frequency band is improved, similarly to the first conventional example, the low impedance of the resonant frequency in the SAW resonator influences the low band side of the passband. This causes the low-band side of the passband to be decreased. However, in the third preferred embodiment, the SAW resonator Z having the impedance characteristic as shown in FIG. 20 is electrically connected in parallel to the SAW filter 1. Therefore, as shown in FIG. 19, amounts of attenuations in the frequency bands in the range of about 884 MHz to about 887 MHz, which is as large as that of the third conventional example, can be obtained.

In addition, in the third preferred embodiment, improvement is achieved for the decrease in the low-band side of the passband, which is a defect in the composite SAW filter in the third conventional example; and filter characteristics which are close to the those of the simple substance of the SAW filter 1 are achieved in the low-band side of the passband. This is attributed to that the effective-electrode ratio in the resonator Z is reduced to about 50%, and the resonant frequency in the SAW resonator Z is adjusted to the low-band side of the passband. This significantly increases impedance of the SAW resonator Z at the frequency in the low-band side of the passband, thereby reducing the influence according to the SAW resonator Z on the low-band side of the passband.

In this way, large amounts of attenuations and preferable insertion losses in the vicinity that is very close to the passband can be realized, as described in the first and second preferred embodiments. As described in the third preferred embodiment, however, not only the above, but also more preferable characteristics in the passband than those obtained by the conventional examples can be obtained even to increase amounts of attenuations in bands that are somewhat remote from the passband.

Suppose that the frequency interval between a frequency at which the large amount attenuation is desired and a frequency in the passband is larger than about 75% of the frequency interval between the resonant frequency and the antiresonant frequency in the regular-type IDT. In this case, since the difference in influences on the passband in cases where the SAW resonator Z having the frequency interval between the resonant frequency and the antiresonant frequency, which corresponds to the aforementioned frequency interval, and where the regular IDT is used, is a level that does not cause any problem, almost no improvement is implemented. Therefore, the third preferred embodiment is significantly effective, especially when the frequency interval between the resonant frequency and the antiresonant frequency is about 75% or less of the frequency interval between the resonant frequency and the antiresonant frequency in the regular-type IDT.

Suppose the frequency interval between a frequency at which the large amount attenuation is desired and a frequency in the pass band is smaller than about 30% of the frequency interval between the resonant frequency and the antiresonant frequency in the regular-type IDT. In this case, an effect of increasing the amount of attenuation in the vicinity of the passband as in the case of the first preferred embodiment is greater than an effect of increasing the amount of attenuation in the band that is somewhat remote from the passband. In consideration that the first preferred embodiment is included in the third preferred embodiment, a great effect is desired for the third preferred embodiment. More specifically, it is desired when the frequency interval between the resonant frequency and the antiresonant frequency in the SAW resonator Z is within a range of about 5% to about 75% of the frequency interval between the resonant frequency and the antiresonant frequency in the case of the regular-type IDT. Also, FIG. 19 indicates that the effective-electrode ratio should be in a range of about 10% to about 80% in order to obtain the above-described frequency interval between the resonant frequency and the antiresonant frequency.

In the third preferred embodiment, the SAW resonator Z is connected in parallel to the SAW filter 1 so that the amount of attenuation on the low-frequency side is increased so as to be higher than that in the passband. However, similarly to the second preferred embodiment, the SAW resonator may be series-connected to the SAW filter 1 so that the amount of attenuation in the high frequency side, which is somewhat remote from the passband, is increased.

For the SAW resonator Z in the third preferred embodiment, a SAW resonator Z is used, which includes an IDT having 80 electrode-finger pairs, 161 electrode fingers, approximately 80-μm cross widths, and the regularity of the electrode-finger arrangement 20E (effective-electrode ratio: 50%) shown in FIG. 2E. For other aspects, the composite SAW filter is configured similarly to the third preferred embodiment.

For electrode-finger arrangement in the SAW resonator Z used in the modification example, the above-described electrode-finger arrangement 20E (refer to FIG. 2E) in which the effective-electrode ratio is about 50% by use of the electrode reversal is used. According to FIG. 9, the frequency interval between the resonant frequency and the antiresonant frequency in the SAW resonator Z is about 30% of the pitch in the regular-type IDT.

As can be known from FIG. 9, the electrode-finger arrangement should be arranged to be the electrode-finger arrangement 20F to perform the withdrawal so as to obtain the same frequency interval between the resonant frequency and the antiresonant frequency as that of the SAW resonator Z. The effective-electrode ratio in the electrode-finger arrangement 20F is preferably about 33%.

As is apparent in FIGS. 10 and 11, according to comparison of impedances of the resonant point and the antiresonant point of each of the electrode-finger arrangements 20E and 20F, the electrode-finger arrangement 20F has higher impedances at both the resonant point and the antiresonant point than the electrode-finger arrangement 20E has.

Figure 21:
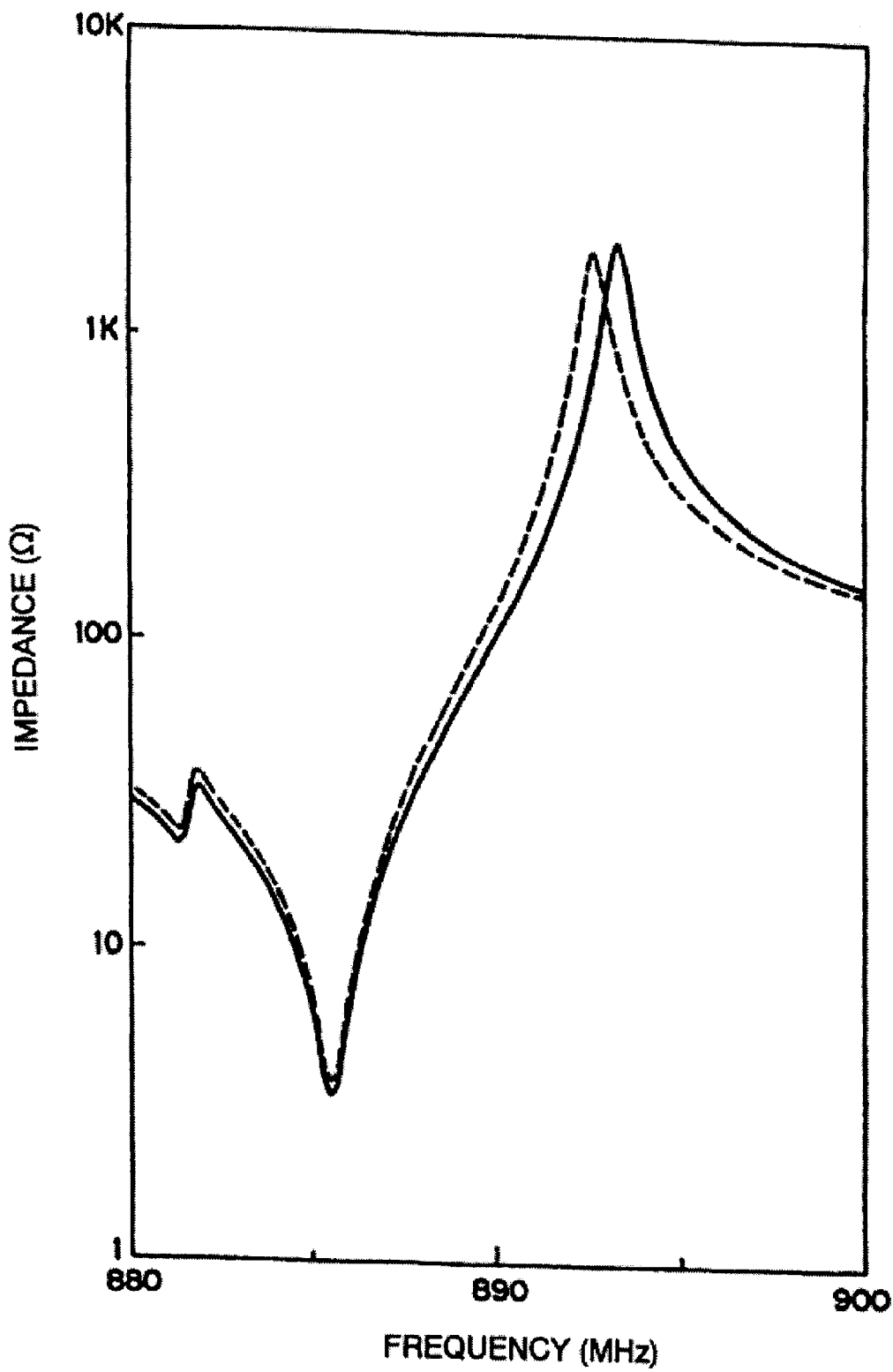
FIG. 21 is a graph showing impedance-frequency characteristics of a SAW resonator used in a composite SAW filter according to an example of a modification of the third preferred embodiment and a SAW resonator including an IDT having an electrode-finger arrangement 20F.

FIG. 21 shows an impedance characteristic (electrode-finger arrangement 20E; cross width: 80 μm) of the SAW resonator Z indicated by a solid line, and an impedance characteristic of a SAW resonator including an IDT that has the above-described electrode-finger arrangement 20F.

The SAW resonator including the IDT, which has the above-described electrode-finger arrangement 20F, has been arranged to have 80 electrode-finger pairs and approximate 160-μm cross widths each of which is twice as large as that in the SAW resonator Z. The difference in the cross width is intended for compensation for the above-described difference in impedance.

Instead of changing the cross width, the number of the electrode fingers may be changed to cause the impedance to vary. For example, in the above-described electrode-finger arrangement 20F, even with the approximate 80-μm cross width remaining unchanged and 160 electrode-finger pairs, substantially the same characteristics can be obtained. The change in either the cross width or the number of the electrode fingers does not substantially influence the frequency interval between the resonant frequency and the antiresonant frequency.

As described above, in the arrangement in which the withdrawal is performed to configure the electrode-finger arrangement 20F, to obtain the same characteristics as in the case where the electrode reversal is performed, the total area of IDT portions in the SAW resonator must be enlarged twice. In other words, use of the electrode reversal instead of the withdrawal for reducing the effective-electrode ratio allows the area of the IDT portions in the SAW resonator to be reduced to half. This advantage can be obtained by changing only some of withdrawal electrodes to be electrically reversed without changing all the withdrawal electrodes to be electrically reduced.

Dimensions of the SAW resonator directly affects dimensions of the piezoelectric substrate. The dimensions of the piezoelectric substrate restrict a package that stores the piezoelectric substrate. Thus, the dimensions of the piezoelectric substrate are very important. In many cases, a prepared package must be replaced by a larger package to store a piezoelectric substrate that is larger by only about 0.1 mm than required. Particularly, miniaturization of electronic components is increasingly required, making the dimensional reduction a serious problem. Therefore, as is clear from the above-described modification example, the reduction in the area of the IDT portions for which electrode reversals are performed is particularly effective so that the aforementioned requirement is met.

Figure 22A:
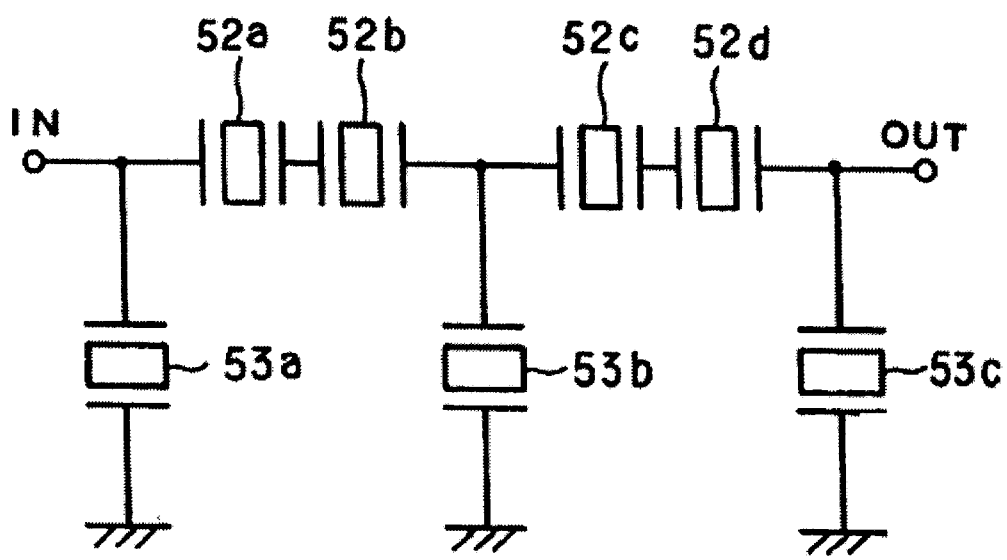
FIGS. 22A and 22B are, respectively, a circuit diagram of a SAW filter of a fourth preferred embodiment and a schematic plan view used to explain an electrode structure in a SAW resonator included therein.
Figure 22B:
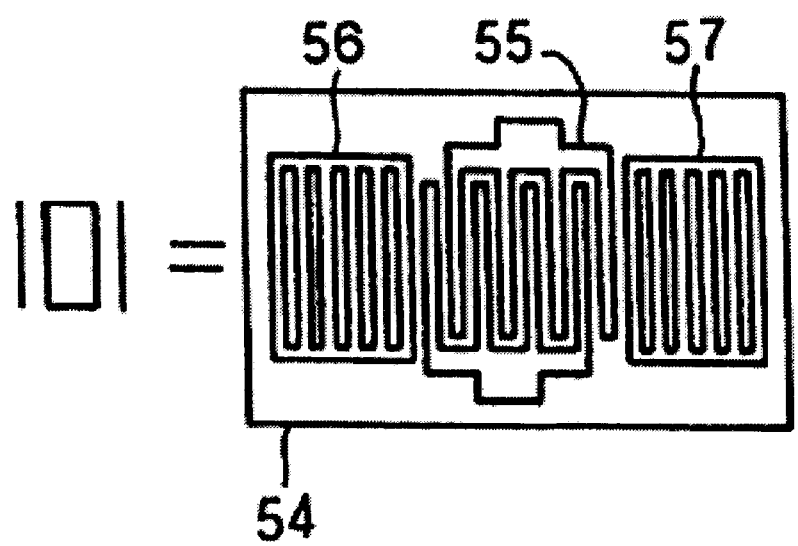

FIGS. 22A and 22B are a circuit diagram used to explain a SAW filter having a ladder-type circuit configuration according to a fourth preferred embodiment of the present invention, and a schematic plan view of a SAW resonator, respectively.

In this preferred embodiment, a plurality of series-arm SAW resonators 52a to 52d and a plurality of shunt-arm SAW resonators 53a to 53c are preferably made of Al materials on a 41-degree Y-cut X-propagation LiNbNO$_3$ substrate.

Each of the SAW resonators 52a to 52d and 53a to 53c is preferably made of a single-pair-terminal SAW resonator according to preferred embodiments of the present invention. As shown in FIG. 22B, the single-pair-terminal SAW resonator has a structure in which an IDT 55 and reflectors 56 and 57 located on two sides in the surface-wave propagation direction of the IDT 55 are disposed on a piezoelectric substrate 54. The piezoelectric substrate 54 is shared by the multiple SAW resonators 52a to 52d and 53a to 53c. Thus, the SAW filter of this preferred embodiment of the present invention is a singe component that includes electrode structures disposed on the single piezoelectric substrate.

Each cross width in the IDTs in the shunt-arm SAW resonators 53a and 53c is preferably about 50 μm, and the number of electrode-finger pairs therein is 105. Each cross width in the shunt resonator 53*b* is preferably about 57 µm, and the number of the electrode finger pairs therein is 150.

In each of the series-arm SAW resonators 52*a* to 52*d*, the cross width is preferably about 80 µm, and the number of electrode fingers is 80; and in the reflector, the number of electrode fingers is 80. For the series-arm resonator 52*a*, the withdrawal is performed so that it has the electrode-finger arrangement 20B (effective-electrode ratio of about 75%) shown in FIG. 2(*b*). In this case, the frequency interval between the IDT and the reflector is 0.5 times (0.5λ) the wave length λ that is determined according to the inter-electrode-finger pitch. The pitch between the IDT and the reflector refers to a center-to-center distance between the electrode fingers of adjacent IDTs and reflection electrode fingers.

In this preferred embodiment, the series-arm resonator 52*a* is configured using the SAW resonator of preferred embodiments of the present invention. That is, the series-arm resonator 52*a* is a SAW resonator in which the effective-electrode ratio is reduced similarly to the SAW resonator 2 of the first preferred embodiment.

Figure 23:
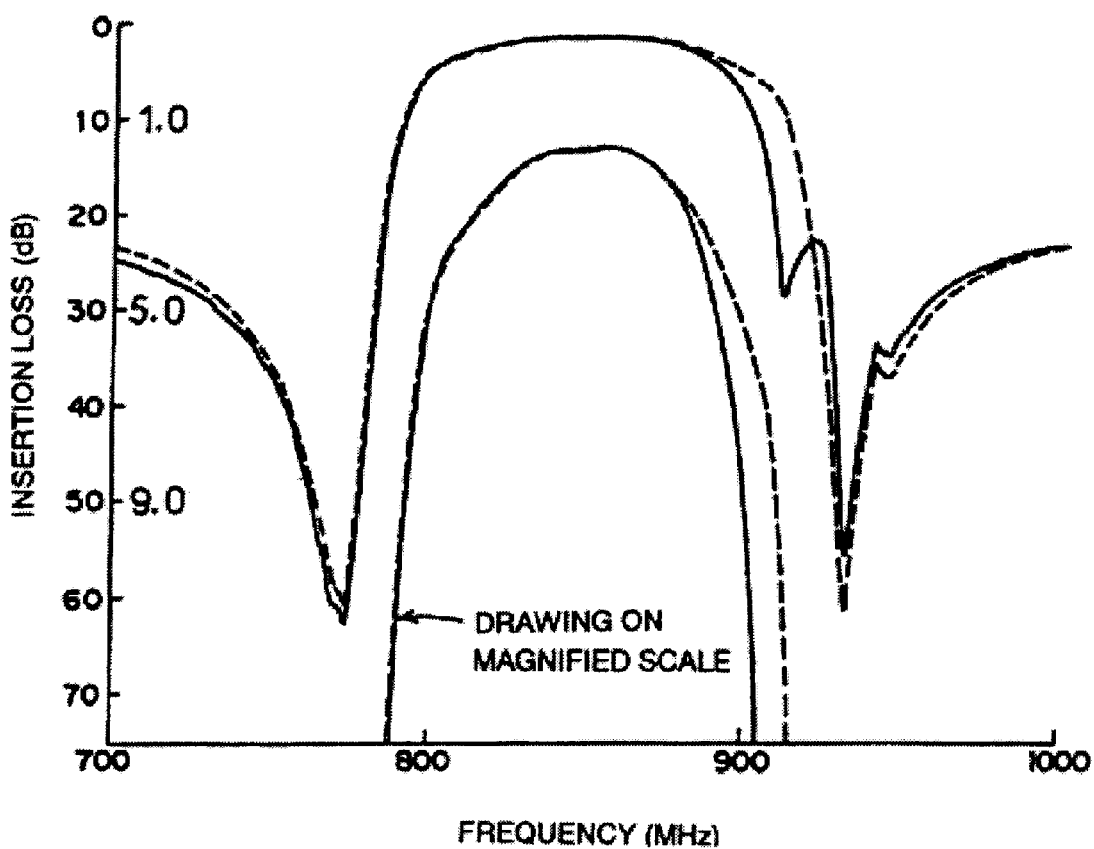
FIG. 23 is a graph showing frequency-amplitude characteristics of the SAW filter of the fourth preferred embodiment and a SAW filter prepared for comparison thereto.
Figure 24:
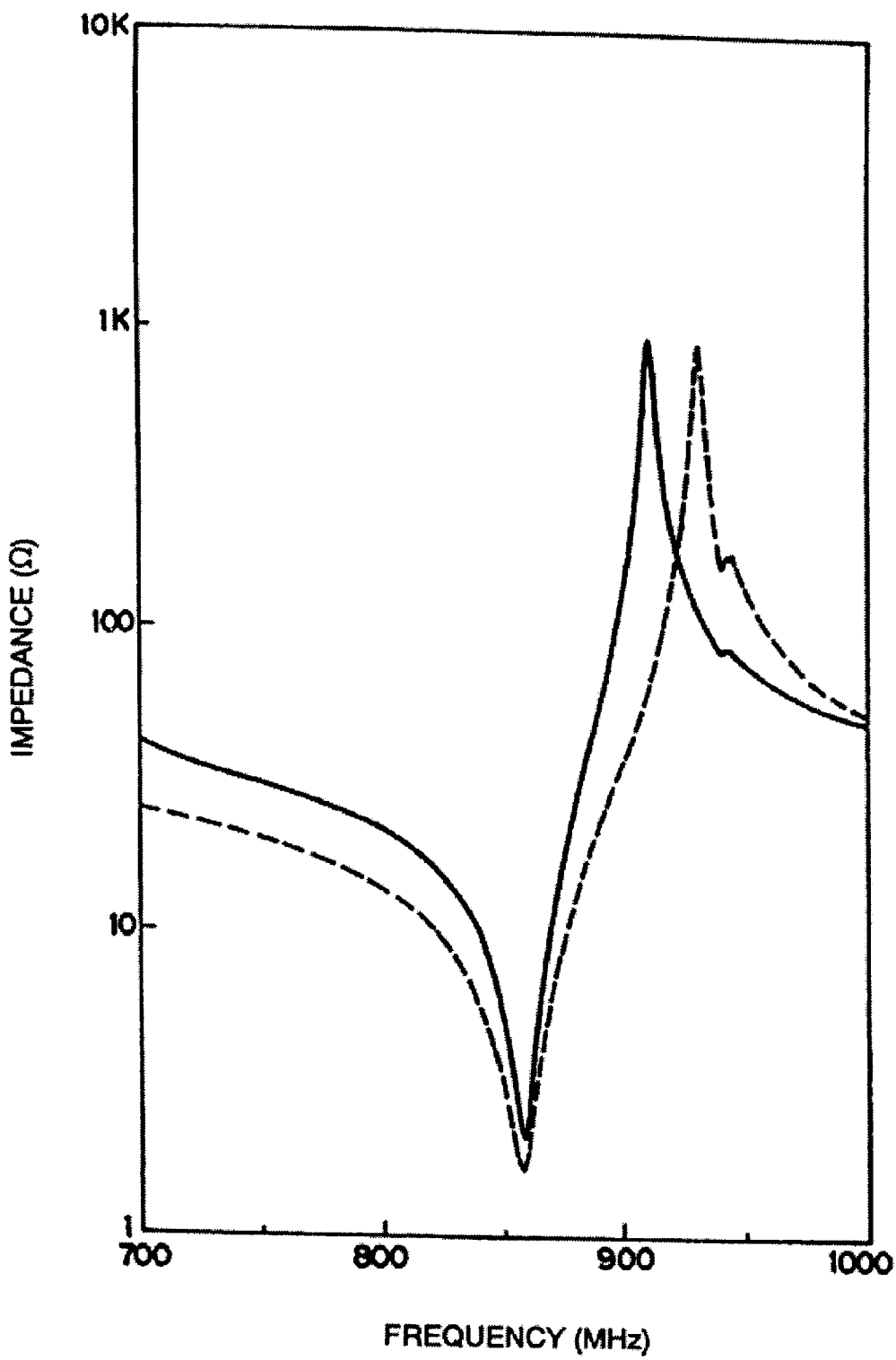
FIG. 24 is a graph showing a SAW filter and SAW resonator defining one of the series-arm resonators in the SAW filter of the fourth preferred embodiment and a SAW resonator for which the withdrawal is not performed.

FIG. 23 uses solid lines to show frequency-amplitude characteristics of the SAW filter of a preferred embodiment of the present invention which has the ladder-type circuit configuration. For comparison, the figure also uses broken lines to show characteristics of a SAW filter used as a replacement of the series-arm resonator 52*a*, which has the ladder-type circuit configuration, the SAW filter being configured similarly thereto except that it uses a standard regular-type SAW resonator. FIG. 24 uses a solid line to show an impedance characteristic of the aforementioned series-arm resonator 52*a* included in this preferred embodiment. The figure also uses a broken line to show impedance characteristics of the series-arm SAW resonators 52*b* to 52*d* each including the regular-type IDT for which the withdrawal is not performed.

As it is apparent in FIG. 24, with the SAW resonator having the impedance characteristic shown in FIG. 24, which is used for the series-arm resonator 52*a*, almost no variation from the through level in the band width of the passband at about 3 dB occurs. However, the sharpness is increased in the vicinity that is very close to the high-band side of the passband. This indicates that while the amount of attenuation in the vicinity of about 910 MHz to about 930 MHz is about 8 dB with the comparative example, it is improved up to about 23 dB with this preferred embodiment.

Thus, it can be known that, as in this preferred embodiment, the SAW resonator of preferred embodiments of the present invention, in which the effective-electrode ratio is small, defines at least one of the series-arm resonators in the SAW filter having the ladder-type circuit configuration. As a result, the sharpness in the filter characteristics in the high-band side of the passband of the SAW filter having the ladder-type circuit configuration is greatly increased.

In the present invention, unlike the first to third preferred embodiments, the amount of attenuation can be improved at effective-electrode ratios of about 95% or less. Also, the lower the effective-electrode ratio becomes, the higher the sharpness in the filter characteristics in the vicinity that is very close to the passband can be. In this preferred embodiment, a preferable lower limit of the effective-electrode ratio is about 10% for the same reason as in the case of the first preferred embodiment.

This preferred embodiment includes the SAW resonator of other preferred embodiments of the present invention for the series-arm resonator 52*a*. However, use of the shunt-arm resonator also allows increase in the sharpness in the filter characteristics in the vicinity that is very close to the low-band side of the passband.

Also, in this preferred embodiment, only the single SAW resonator is configured using the SAW resonator of the present invention. However, either all the series-arm resonators or all the shunt-arm resonators, or all the series-arm resonators and shunt-arm resonators may be configured using the SAW resonator of preferred embodiments of the present invention.

That is, the sharpness in the filter characteristics in the vicinity that is very close to the passband can be increased by using the SAW resonator of certain preferred embodiments of the present invention for at least one of the series-arm resonators and/or the shunt-arm resonators in the ladder-type SAW filter.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A composite SAW filter comprising:
   at least one resonator which is at least one of electrically series-connected and connected in parallel to a SAW filter via at least one of an input-end side and an output-end side of the SAW filter; wherein
   the at least one resonator includes:
     a piezoelectric substrate;
     an interdigital transducer on the piezoelectric substrate, the interdigital transducer including first and second comb-shaped electrodes having a plurality of electrode fingers which are interdigitated with each other; wherein
     when the first-comb-shaped electrode is connected to a positive potential, the second comb-shaped electrode is connected to a negative potential, and the electrode finger connected to the positive potential and the electrode finger connected to the negative potential are reversed in at least one pair of the electrode fingers in an area where electrode fingers connected to the positive potential and electrode fingers connected to the negative potential are alternately arranged in the direction of surface-wave propagation.

2. The composite SAW filter according to claim 1, wherein the at least one resonator is series-connected to the SAW filter, and the antiresonant frequency is in a stopband in the vicinity of the high-band side of the passband of the SAW filter.

3. The composite SAW filter according to claim 1, wherein the at least one resonator is connected in parallel to the SAW filter, and the resonant frequency is available in a stopband in the vicinity of the low-band side of the passband of the SAW filter.

4. The composite SAW filter according to claim 1, wherein the piezoelectric substrate is made of $LiTaO_3$.

5. The composite SAW filter according to claim 1, wherein an effective-electrode ratio in the interdigital transducer is in a range of about 10% to about 80%.

6. The composite SAW filter according to claim 1, wherein a frequency interval between a resonant frequency and an antiresonant frequency is in a range of about 5% to 75% of a frequency interval between a resonant frequency and an antiresonant frequency in a regular-type interdigital transducer having the same number of electrode-finger pairs.

7. The composite SAW filter according to claim 1, wherein an effective electrode ratio in the interdigital transducer is in a range of about 10% to about 50%.

8. The composite SAW filter according to claim 1, wherein a frequency interval between a resonant frequency and an antiresonant frequency is in a range of about 5% to about 30% of a frequency interval between a resonant frequency and an antiresonant frequency in a regular-type interdigital transducer having the same number of electrode-finger pairs.

9. The composite SAW filter according to claim 1, further comprising reflectors provided outside of the interdigital transducer in the direction of surface-wave propagation.

10. A composite SAW filter comprising:
    at least one resonator which is at least one of electrically series-connected and connected in parallel to a SAW filter via at least one of an input-end side and an output-end side of the SAW filter; wherein
    the at least one resonator includes:
      a piezoelectric substrate; and
      an interdigital transducer on the piezoelectric substrate, the interdigital transducer including first and second comb-shaped electrodes having a plurality of electrode fingers which are interdigitated with each other; wherein
    the interdigital transducer is one of withdrawal weighted and electrode-reversed and an effective electrode-ratio in the interdigital transducer is about 10% to about 80%.

11. The composite SAW filter according to claim 10, wherein the at least one resonator is series-connected to the SAW filter, and the antiresonant frequency is in a stopband in the vicinity of the high-band side of the passband of the SAW filter.

12. The composite SAW filter according to claim 10, wherein the at least one resonator is connected in parallel to the SAW filter, and the resonant frequency is available in a stopband in the vicinity of the low-band side of the passband of the SAW filter.

13. The composite SAW filter according to claim 10, wherein the piezoelectric substrate is made of $LiTaO_3$.

14. The composite SAW filter according to claim 10, wherein a frequency interval between a resonant frequency and an antiresonant frequency is in a range of about 5% to 75% of a frequency interval between a resonant frequency and an antiresonant frequency in a regular-type interdigital transducer having the same number of electrode-finger pairs.

15. The composite SAW filter according to claim 10, wherein an effective-electrode ratio in the interdigital transducer is in a range of about 10% to 50%.

16. The composite SAW filter according to claim 10 wherein a frequency interval between a resonant frequency and an antiresonant frequency is in a range of about 5% to about 30% of a frequency interval between a resonant frequency and an antiresonant frequency in a regular-type interdigital transducer having the same number of electrode-finger pairs.

17. The composite SAW filter according to claim 10, further comprising reflectors provided outside of the interdigital transducer in the direction of surface-wave propagation.

* * * * *